(12) United States Patent
Park et al.

(10) Patent No.: US 11,974,434 B2
(45) Date of Patent: Apr. 30, 2024

(54) INTEGRATED CIRCUIT DEVICE AND METHOD OF MANUFACTURING THE SAME

(71) Applicant: Samsung Electronics Co., Ltd., Suwon-si (KR)

(72) Inventors: Sangyong Park, Suwon-si (KR); Hyunseok Na, Busan (KR); Jaeduk Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 30 days.

(21) Appl. No.: 17/824,821

(22) Filed: May 25, 2022

(65) Prior Publication Data

US 2022/0293632 A1    Sep. 15, 2022

Related U.S. Application Data

(62) Division of application No. 16/936,888, filed on Jul. 23, 2020, now Pat. No. 11,380,706.

(30) Foreign Application Priority Data

Aug. 8, 2019    (KR) .......................... 10-2019-0096921

(51) Int. Cl.
*H10B 43/27*    (2023.01)
*H10B 41/27*    (2023.01)
*H10B 41/10*    (2023.01)
*H10B 43/10*    (2023.01)

(52) U.S. Cl.
CPC .............. *H10B 43/27* (2023.02); *H10B 41/27* (2023.02); *H10B 41/10* (2023.02); *H10B 43/10* (2023.02)

(58) Field of Classification Search
None
See application file for complete search history.

(56) References Cited

U.S. PATENT DOCUMENTS

| 9,112,045 | B2 | 8/2015 | Kim et al. | |
| 9,214,351 | B2 | 12/2015 | Hsiao et al. | |
| 9,553,105 | B2 * | 1/2017 | Lee | .............. H01L 29/40117 |
| 9,634,097 | B2 | 4/2017 | Rabkin et al. | |
| 9,653,473 | B2 | 5/2017 | Lee et al. | |

(Continued)

OTHER PUBLICATIONS

German Office Action, dated Apr. 26, 2023, issued in corresponding German Patent Application No. 102020107290.2.

*Primary Examiner* — Hsien Ming Lee
(74) *Attorney, Agent, or Firm* — Harness, Dickey & Pierce, P.L.C.

(57) ABSTRACT

An integrated circuit device includes a plurality of conductive lines extending in a horizontal direction parallel to a main surface of a substrate and overlapping one another in a vertical direction vertical to the main surface, on the substrate, a plurality of insulation layers each between two adjacent conductive lines of the plurality of conductive lines to extend in the horizontal direction, a channel layer extending in the vertical direction in a channel hole passing through the plurality of conductive lines and the plurality of insulation layers, and a plurality of outer blocking dielectric layers between the plurality of conductive lines and the channel layer, in at least some of the plurality of conductive lines, wherein a width of each of the plurality of outer blocking dielectric layers in the horizontal direction increases toward the main surface.

18 Claims, 32 Drawing Sheets

(56) References Cited

U.S. PATENT DOCUMENTS

| | | |
|---|---|---|
| 9,666,590 B2 | 5/2017 | Chien et al. |
| 9,753,657 B2 | 9/2017 | Yang et al. |
| 9,991,277 B1 | 6/2018 | Tsutsumi et al. |
| 9,997,462 B2 | 6/2018 | Ha et al. |
| 2012/0261827 A1 | 10/2012 | Yu et al. |
| 2014/0362642 A1 | 12/2014 | Dong et al. |
| 2016/0086665 A1 | 3/2016 | Hsiao et al. |
| 2017/0062456 A1 | 3/2017 | Sugino et al. |
| 2018/0175054 A1 | 6/2018 | Baraskar et al. |
| 2018/0323208 A1 | 11/2018 | Sugino et al. |
| 2019/0067321 A1 | 2/2019 | Song et al. |
| 2019/0067323 A1 | 2/2019 | Xu et al. |
| 2019/0080913 A1 | 3/2019 | Ko et al. |
| 2019/0081068 A1 | 3/2019 | Huang et al. |
| 2020/0402906 A1 | 12/2020 | Lim |

\* cited by examiner

INTEGRATED CIRCUIT DEVICE AND METHOD OF MANUFACTURING THE SAME

CROSS-REFERENCE TO RELATED APPLICATION

This application is a divisional of U.S. patent application Ser. No. 16/936,888, filed on Jul. 23, 2020, which claims the benefit of Korean Patent Application No. 10-2019-0096921, filed on Aug. 8, 2019, in the Korean Intellectual Property Office, the disclosure of each of which is incorporated herein in its entirety by reference.

BACKGROUND

The inventive concepts relate to an integrated circuit device and a method of manufacturing the same, and more particularly, to an integrated circuit device including a non-volatile vertical memory device and a method of manufacturing the integrated circuit device.

In order to satisfy improved performance and a more affordable price, it may be advantageous to increase a degree of integration of each integrated circuit device. For example, a degree of integration of each memory device is a significant factor for determining the product price. A degree of integration of each two-dimensional (2D) memory device is mainly determined based on an area occupied by a unit memory cell, and thus, is greatly affected by a level of micro pattern forming technology. However, since expensive equipment is needed for forming a micro pattern and an area of a chip die is limited, a degree of integration of each 2D memory device increases, but is still limited. Vertical memory devices having a three-dimensional (3D) structure have been developed to improve memory integration.

SUMMARY

The inventive concepts provide an integrated circuit device, in which a blocking dielectric layer is provided in each of the inside and the outside of a channel hole in a vertical memory device having a three-dimensional (3D) structure and including the channel hole having a high aspect ratio, and a method of manufacturing the integrated circuit device.

Inventive concepts are not limited to the aforesaid, but other advantages not described herein will be clearly understood by those of ordinary skill in the art from descriptions below.

According to an aspect of the inventive concepts, there is provided an integrated circuit device including a plurality of conductive lines extending in a horizontal direction parallel to a main surface of a substrate and overlapping one another in a vertical direction vertical to the main surface, on the substrate, a plurality of insulation layers each between two adjacent conductive lines of the plurality of conductive lines to extend in the horizontal direction, a channel layer extending in the vertical direction in a channel hole passing through the plurality of conductive lines and the plurality of insulation layers, and a plurality of outer blocking dielectric layers between the plurality of conductive lines and the channel layer, in at least some of the plurality of conductive lines, wherein a width of each of the plurality of outer blocking dielectric layers in the horizontal direction increases toward the main surface.

According to another aspect of the inventive concepts, there is provided an integrated circuit device including a first stacked structure including a plurality of first conductive lines extending in a first direction in parallel with a main surface of a substrate and overlapping one another in a vertical direction vertical to the main surface, on the substrate, a second stacked structure including a plurality of second conductive lines extending in the first direction in parallel with the main surface of the substrate and overlapping one another in the vertical direction vertical to the main surface, on the first stacked structure, a channel layer extending in the vertical direction, in a channel hole passing through the first and second stacked structures, and a plurality of outer blocking dielectric layers between the plurality of first and second conductive lines and the channel layer, in all of the plurality of first conductive lines and at least some of the plurality of second conductive lines, wherein a width of each of the plurality of outer blocking dielectric layers in a horizontal direction increases toward the main surface.

According to another aspect of the inventive concepts, there is provided an integrated circuit device including a plurality of conductive lines extending in a horizontal direction parallel to a main surface of a substrate and overlapping one another in a vertical direction vertical to the main surface, on the substrate, a plurality of insulation layers each between two adjacent conductive lines of the plurality of conductive lines to extend in the horizontal direction, a channel layer extending in the vertical direction in a channel hole passing through the plurality of conductive lines and the plurality of insulation layers, a charge storage layer and a first blocking dielectric layer each extending in an extension direction of the channel layer between the plurality of conductive lines and the channel layer, in the channel hole, and a plurality of second blocking dielectric layers between the plurality of conductive lines and the first blocking dielectric layer and between the plurality of conductive lines and the plurality of insulation layers, in at least some of the plurality of conductive lines, wherein, with respect to the channel hole, a first width of a second blocking dielectric layer of an uppermost conductive line among the plurality of conductive lines operating as a memory cell is set in the horizontal direction, a second width of a second blocking dielectric layer of a lowermost conductive line among the plurality of conductive lines operating as a memory cell is set in the horizontal direction, a third width of a second blocking dielectric layer of a center conductive line closest to the uppermost conductive line and the lowermost conductive line in the vertical direction is set in the horizontal direction, the third width is greater than the first width, and the second width is greater than the third width.

According to another aspect of the inventive concepts, there is provided a method of an integrated circuit device, the method including forming a structure where a plurality of insulation layers and a plurality of sacrificial layers are alternately stacked, on a substrate, forming a channel hole passing through the structure, sequentially forming a first blocking dielectric layer, a charge storage layer, and a tunneling dielectric layer, in the channel hole, forming a channel layer on the tunneling dielectric layer, in the channel hole, forming a conductive line space between two adjacent insulation layers of the plurality of insulation layers by removing the plurality of sacrificial layers, forming a second blocking preliminary dielectric layer conformally covering an inner wall of the conductive line space, removing a portion of the second blocking preliminary dielectric layer to separate the second blocking preliminary dielectric layer into a plurality of second blocking dielectric layers, and forming a conductive line filled into the conductive line space, wherein a width of each of the plurality of second blocking dielectric layers in a horizontal direction increases toward the substrate.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF EMBODIMENTS

Hereinafter, embodiments will be described in detail with reference to the accompanying drawings.

Figure 1:
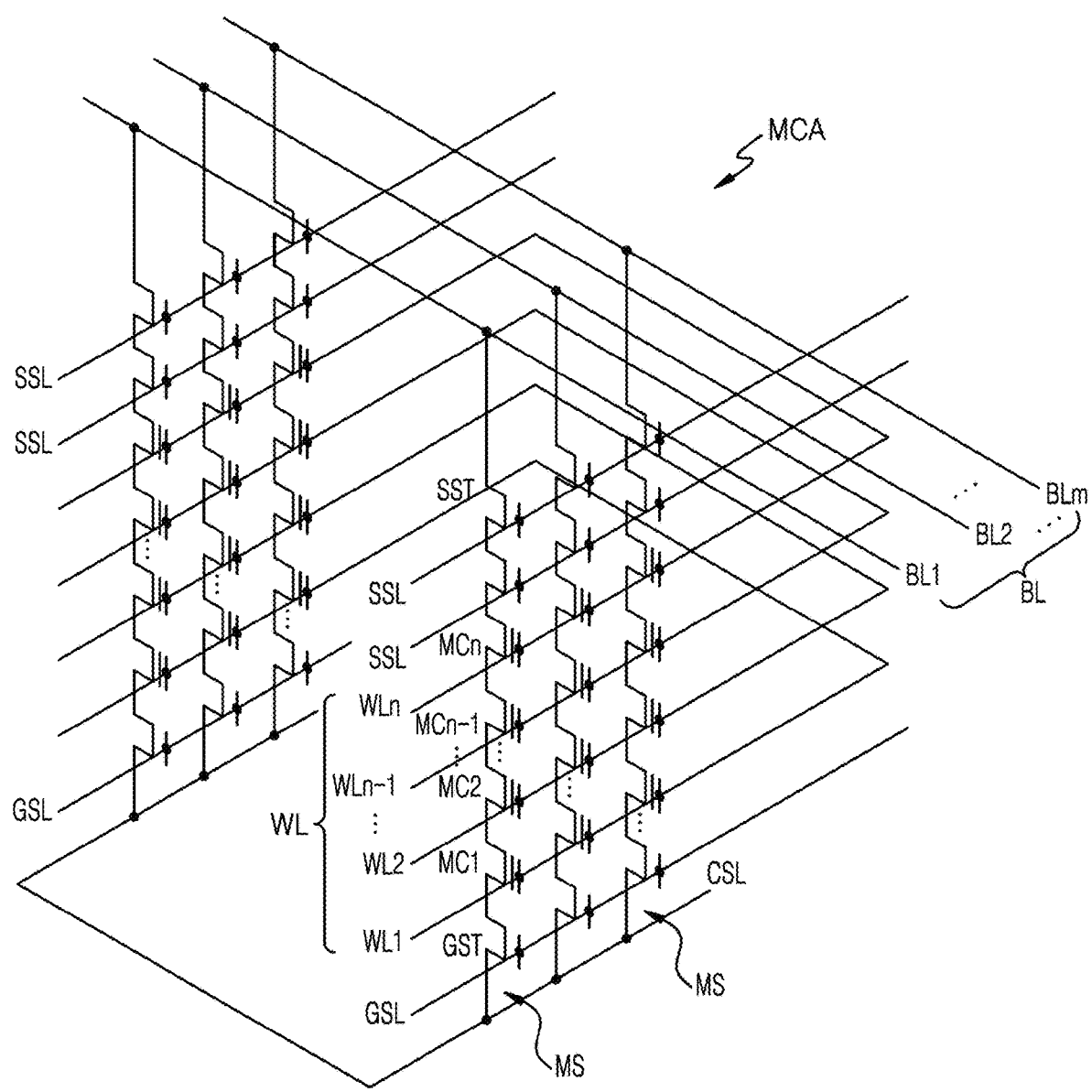
FIG. 1 is an equivalent circuit diagram of a memory cell array of an integrated circuit device according to an embodiment.

FIG. 1 is an equivalent circuit diagram of a memory cell array of an integrated circuit device according to an embodiment.

Referring to FIG. 1, an equivalent circuit diagram of a vertical NAND flash memory device having a vertical channel structure is illustrated.

A memory cell array MCA may include a plurality of memory cell strings MS. The memory cell array MCA may include a plurality of bit lines BL (BL1 to BLm), a plurality of word lines WL (WL1 to WLn), at least one string selection line SSL, at least one ground selection line GSL, and/or a common source line CSL. The plurality of memory cell strings MS may be provided between the plurality of bit lines BL (BL1 to BLm) and the common source line CSL.

The plurality of memory cell strings MS may each include a string selection transistor SST, a ground selection transistor GST, and/or a plurality of memory cell transistors MC1 to MCn. A drain region of the string selection transistor SST may be connected to a corresponding bit line of the bit lines BL (BL1 to BLm), and a source region of the ground selection transistor GST may be connected to the common source line CSL. The common source line CSL may be a region which is connected to source regions of a plurality of ground selection transistors GST in common.

The string selection transistor SST may be connected to the string selection line SSL, and the ground selection transistor GST may be connected to the ground selection line GSL. The plurality of memory cell transistors MC1 to MCn may be respectively connected to the plurality of word lines WL (WL1 to WLn).

Figure 2:
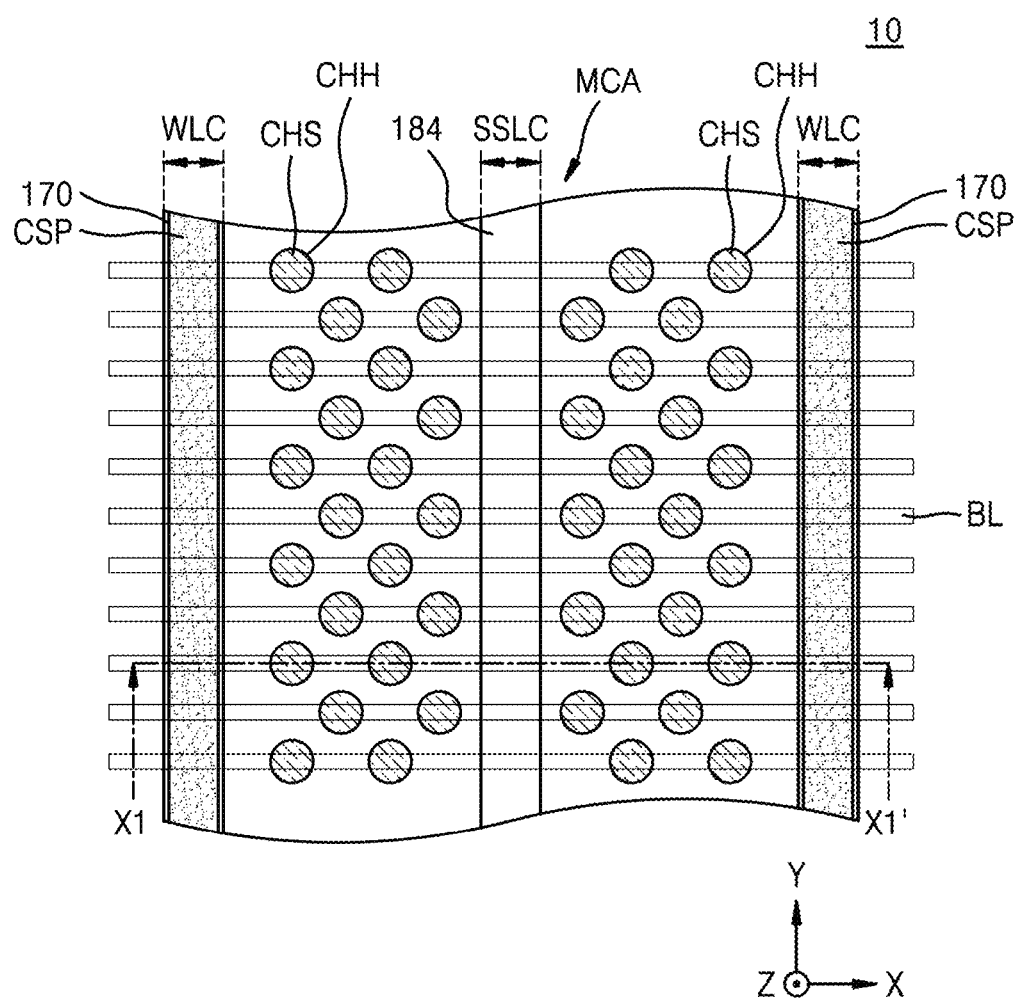
FIG. 2 is a plan view illustrating an integrated circuit device according to an embodiment.
Figure 3A:
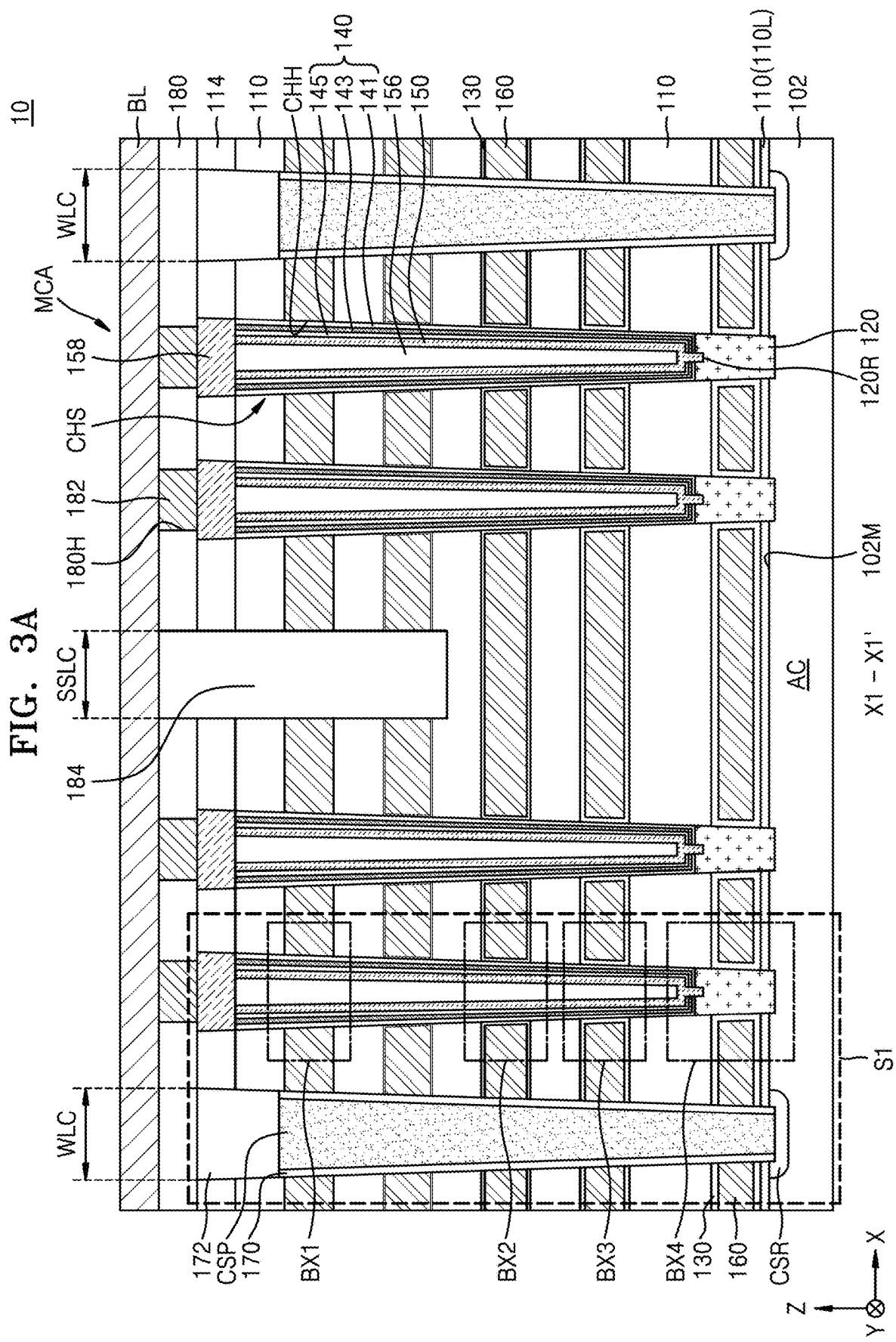
FIG. 3A is a cross-sectional view taken along line X1-X1' of FIG. 2, and FIGS. 3B to 3E are enlarged cross-sectional views of dotted-line regions BX1 to BX4 of FIG. 3A, respectively.
Figure 3B:
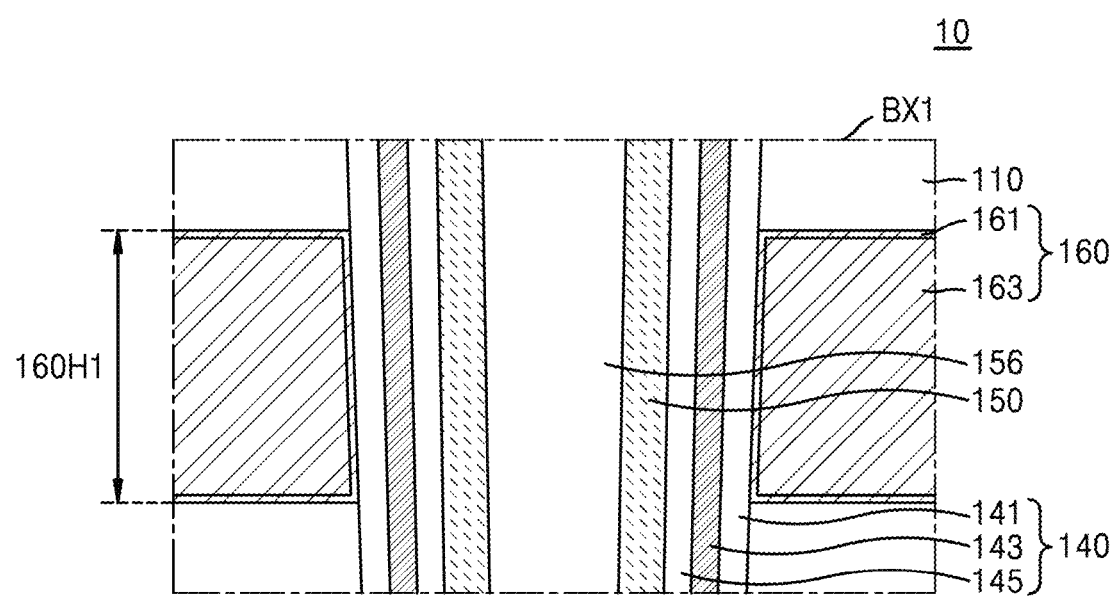
Figure 3C:
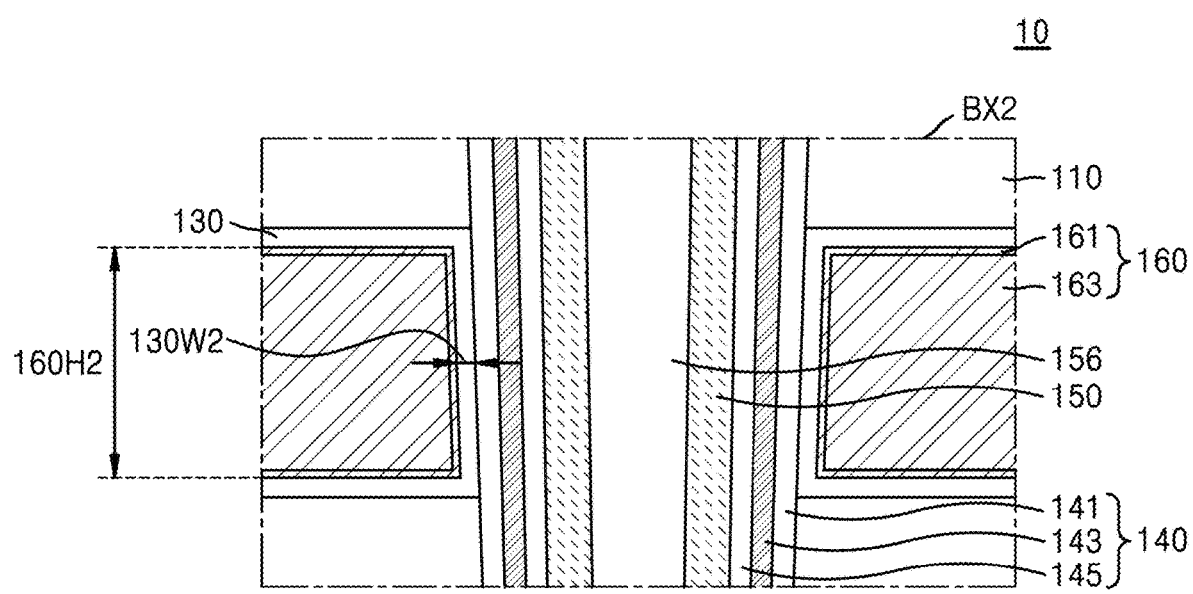
Figure 3D:
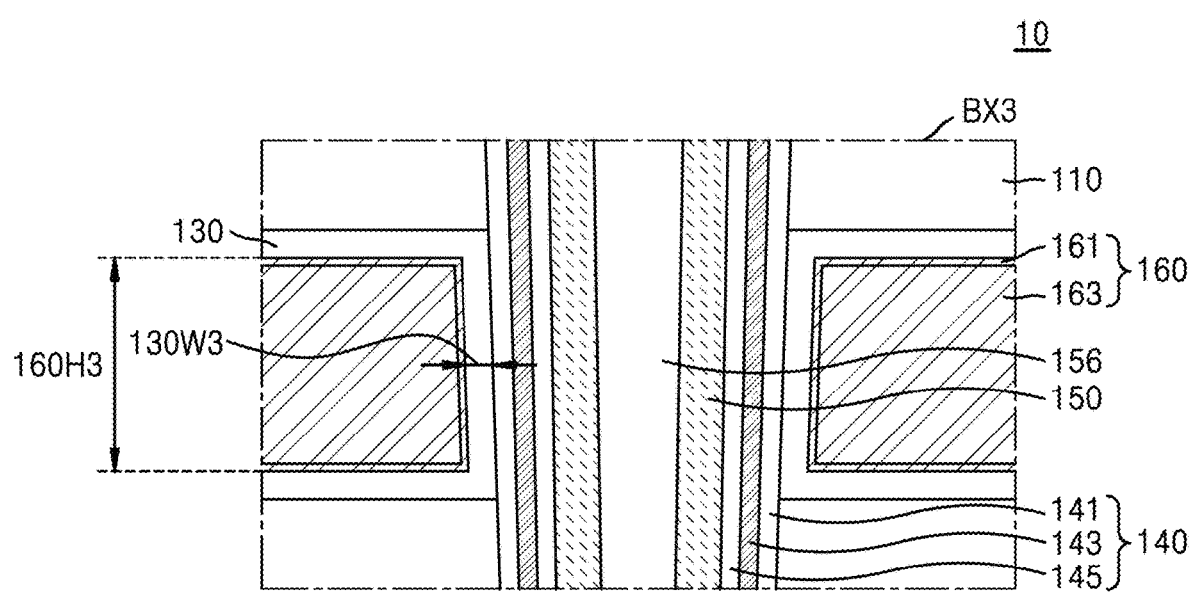

FIG. 2 is a plan view illustrating an integrated circuit device 10 according to an embodiment, FIG. 3A is a cross-sectional view taken along line X1-X1' of FIG. 2, and FIGS. 3B to 3E are enlarged cross-sectional views of dotted-line regions BX1 to BX4 of FIG. 3A, respectively.

Referring to FIGS. 2 and 3A, the integrated circuit device 10 may include a substrate 102 including an active region AC, and a memory cell array MCA may be provided on the active region AC of the substrate 102. The memory cell array MCA may have a circuit configuration described above with reference to FIG. 1.

The substrate 102 may include a main surface 102M which extends in an X direction and a Y direction. In some embodiments, the substrate 102 may include silicon (Si), germanium (Ge), or silicon germanium (SiGe). In some other embodiments, the substrate 102 may include a silicon-on-insulator (SOI) substrate or a germanium-on-insulator (GeOI) substrate.

A plurality of conductive lines 160 may extend along an X-Y plane in a horizontal direction parallel to the main surface 102M on the substrate 102 and may be disposed apart from one another to overlap one another in a Z direction vertical to the main surface 102M of the substrate 102. A plurality of insulation layers 110 may extend in a horizontal direction on the substrate 102. Each of the plurality of insulation layers 110 may be disposed between two adjacent conductive lines 160 of the plurality of conductive lines 160.

A plurality of channel holes CHH may be formed to pass through the plurality of conductive lines 160 and the plurality of insulation layers 110, and a plurality of channel structures CHS may extend in a vertical direction (a Z direction) in the plurality of channel holes CHH. The plurality of channel structures CHS may each include a semiconductor pattern 120 which contacts the substrate 102 and is partially filled into a corresponding channel hole CHH, a channel layer 150 which contacts the semiconductor pattern 120 and extends in a vertical direction (the Z direction) in the corresponding channel hole CHH, a buried insulation layer 156 which is filled into an internal space of the channel layer 150, and a drain region 158 which contacts the channel layer 150 and is filled into an upper portion of an inlet of the corresponding channel hole CHH.

Each of the plurality of channel holes CHH may have a tapered shape of which a diameter is progressively reduced toward the main surface 102M of the substrate 102. That is, a diameter of an uppermost surface of each channel hole CHH may be set to be greater than that of a lowermost surface of a corresponding channel hole CHH. Such a phenomenon may progressively increase as the number of conductive lines 160 and the number of insulation layers 110 increase.

In some embodiments, the channel layer 150 may have a cylinder shape including an internal space, and the internal space of the channel layer 150 may be filled with the buried insulation layer 156. The channel layer 150 may include doped polysilicon or undoped polysilicon. The buried insulation layer 156 may include silicon oxide, silicon nitride, silicon oxynitride, or a combination thereof. In some embodiments, the buried insulation layer 156 may be omitted, and in this case, the channel layer 150 may have a pillar structure including no internal space. The drain region 158 may include doped polysilicon. A plurality of drain regions 158 may be insulated from one another by an insulation pattern 114. The insulation pattern 114 may include oxide, nitride, or a combination thereof.

The plurality of channel structures CHS may respectively include a plurality of gate insulation layers 140. Each of the plurality of gate insulation layers 140 may include a tunneling dielectric layer 145, a charge storage layer 143, and a first blocking dielectric layer 141 in this order from the channel layer 150.

The tunneling dielectric layer 145 may include at least one of silicon oxide, silicon nitride, silicon oxynitride, hafnium oxide, hafnium silicon oxide, aluminum oxide, and zirconium oxide.

The charge storage layer 143 may include a charge trapping or floating gate conductive layer. When the charge storage layer 143 includes a floating gate conductive layer, the charge storage layer 143 may include, for example, polysilicon. When the charge storage layer 143 includes a charge trapping layer, the charge storage layer 143 may include, for example, at least one of silicon oxide, silicon nitride, silicon oxynitride, hafnium oxide, zirconium oxide, tantalum oxide, titanium oxide, aluminum oxide, and aluminum gallium nitride.

The first blocking dielectric layer 141 may include silicon oxide, silicon nitride, silicon oxynitride, or a high dielectric material. A dielectric constant of a material included in the first blocking dielectric layer 141 may be higher than that of a material included in the tunneling dielectric layer 145. The first blocking dielectric layer 141 may be provided in each of the channel holes CHH, and thus, may be referred to as an inner blocking dielectric layer.

Each of the plurality of gate insulation layers 140 may extend along a rectilinear line extending in a direction distancing from the substrate 102, in a corresponding channel hole CHH, and a width of each gate insulation layer 140 in a horizontal direction may decrease toward the main surface 102M of the substrate 102. That is, the tunneling dielectric layer 145, the charge storage layer 143, and the first blocking dielectric layer 141 in each of the plurality of gate insulation layers 140 may have the same characteristics. For example, a width of the first blocking dielectric layer 141 in a horizontal direction may decrease toward the main surface 102M of the substrate 102.

A second blocking dielectric layer 130 surrounding a portion of the first blocking dielectric layer 141 and a conductive line 160 may be provided between two adjacent insulation layers 110 of the plurality of insulation layers 110. The second blocking dielectric layer 130 may include substantially the same material as that of the first blocking dielectric layer 141. However, an etch rate of the second blocking dielectric layer 130 may differ from that of the first blocking dielectric layer 141. That is, a density of the second blocking dielectric layer 130 may differ from that of the first blocking dielectric layer 141. The second blocking dielectric layer 130 may be provided outside a corresponding channel hole CHH, and thus, may be referred to as an outer blocking dielectric layer. The second blocking dielectric layer 130 will be described below in detail.

A width of each of the plurality of conductive lines 160 and the plurality of insulation layers 110 in a first horizontal direction (an X direction) may be limited by the plurality of word line cut regions WLC. The plurality of conductive lines 160 may be repeatedly disposed apart from one another by a certain interval by using the plurality of word line cut regions WLC.

A plurality of common source regions CSR may extend in a second horizontal direction (a Y direction) on the substrate 102. The plurality of common source regions CSR may each be an impurity region on which impurities are doped at a high concentration. Some of the plurality of word line cut regions WLC may be filled with a common source pattern CSP. The common source pattern CSP may configure the common source line CSL illustrated in FIG. 1. The common source pattern CSP may extend long in the second horizontal direction (the Y direction) in the plurality of common source regions CSR.

An insulation spacer 170 covering a sidewall of the common source pattern CSP may be provided in each of the plurality of word line cut regions WLC. The insulation spacer 170 may electrically insulate the common source pattern CSP from the plurality of conductive lines 160. The common source pattern CSP and the insulation spacer 170 may be covered by a capping insulation layer 172.

The common source pattern CSP may include metal such as tungsten, copper, or aluminum, conductive nitride such as titanium nitride or tantalum nitride, transition metal such as titanium or tantalum, or a combination thereof. Each of the insulation spacer 170 and the capping insulation layer 172 may include silicon oxide, silicon nitride, silicon oxynitride, or a combination thereof. A metal silicide layer (not shown) for lowering a contact resistance may be disposed between each of the commons source regions CSR and the common source pattern CSP.

The plurality of conductive lines 160 between two adjacent word line cut regions WLC may configure the ground selection line GSL, the plurality of word lines WL (WL1 to WLn), and the string selection line SSL each described above with reference to FIG. 1. The number of conductive lines 160 stacked on the substrate 102 in the Z direction may be variously determined depending on the case. For example, a conductive line 160 close to the substrate 102 among the plurality of conductive lines 160 may configure the ground selection line GSL. Also, each of two conductive lines 160 farthest away from the substrate 102 among the plurality of conductive lines 160 may configure the string selection line SSL. The string selection line SSL may include portions apart from each other by a string selection line cut region SSLC. The string selection line cut region SSLC may be covered by the insulation layer 184. The insulation layer 184 may include oxide, nitride, an air gap, or a combination thereof.

In the memory cell array MCA, a plurality of bit lines BL may extend in the first horizontal direction (the X direction) on the plurality of channel structures CHS. A plurality of bit line contact pads 182 may be disposed between the plurality of bit lines BL and the plurality of channel structures CHS. A drain region 158 of each of the plurality of channel structures CHS may be connected to one corresponding bit line BL of the plurality of bit lines BL through a corresponding bit line contact pad 182. The plurality of bit line contact pads 182 may be insulated from one another by the insulation layer 180. The insulation layer 180 may include oxide, nitride, or a combination thereof.

Referring to FIGS. 3B to 3E, it is illustrated that a width of each of a plurality of second blocking dielectric layers 130 in a horizontal direction increases toward the Z direction vertical to the main surface 102M of the substrate 102.

Each of the plurality of conductive lines 160 may include a liner conductive layer 161 and a center conductive layer 163. The liner conductive layer 161 may include metal silicide such as tungsten silicide, nickel silicide, cobalt silicide, or tantalum silicide. The center conductive layer 163 may include doped polysilicon or metal such as tungsten, nickel, cobalt, or tantalum.

The integrated circuit device 10 may include the plurality of second blocking dielectric layers 130 disposed between the plurality of conductive lines 160 and the first blocking dielectric layer 141, in at least some of the plurality of conductive lines 160. For example, each of the second blocking dielectric layers 130 may be provided to contact a portion of the first blocking dielectric layer 141 and surround a corresponding conductive line 160, between two adjacent insulation layers 110 of the plurality of insulation layers 110. A width of each of the plurality of second blocking dielectric layers 130 in the horizontal direction may be about 100 nm or less, and for example, may be about 60 nm or less.

In some embodiments, each of the second blocking dielectric layers 130 may not be provided at a conductive line 160, disposed at an upper end, of the plurality of conductive lines 160. Each of the second blocking dielectric layers 130 may have a second width 130W2 at a conductive line 160, disposed at a center end, of the plurality of conductive lines 160. Also, each of the second blocking dielectric layers 130 may have a third width 130W3 at a conductive line 160, disposed at a lower end, of the plurality of conductive lines 160. Here, the second width 130W2 may be less than the third width 130W3.

A sum of a vertical-direction thickness of one conductive line 160 and a vertical-direction thickness of a second blocking dielectric layer 130 surrounding the one conductive line 160 may be constant all over the plurality of conductive lines 160. Therefore, since a width of each of the plurality of second blocking dielectric layers 130 in the horizontal direction increases toward the Z direction vertical to the main surface 102M of the substrate 102, a thickness of each of the plurality of conductive lines 160 in a vertical direction may decrease toward the Z direction vertical to the main surface 102M of the substrate 102.

In other words, in the plurality of conductive lines 160, a conductive line 160 disposed at an upper end may have a first thickness 160H1, a conductive line 160 disposed at a center end may have a second thickness 160H2, and a conductive line 160 disposed at a lower end may have a third thickness 160H3. Here, the first thickness 160H1 may be greater than the second thickness 160H2, and the second thickness 160H2 may be greater than the third thickness 160H3.

Each of the second blocking dielectric layers 130 may be disposed between the semiconductor pattern 120 and a conductive line 160 which are filled into a lowermost end of a corresponding channel hole CHH. That is, the semiconductor pattern 120 and a corresponding conductive line 160 may not directly contact each other and may be disposed apart from each other by a certain distance. However, the gate insulation layer 140 may not be provided at a lowermost end of a corresponding channel hole CHH where the semiconductor pattern 120 is provided, and thus, a corresponding second blocking dielectric layer 130 may not contact the first blocking dielectric layer 141.

As described above, a width of the first blocking dielectric layer 141 in a horizontal direction may decrease toward the Z direction vertical to the main surface 102M of the substrate 102. Also, a material included in the first blocking dielectric layer 141 may be substantially the same as a material included in each of the second blocking dielectric layers 130. In other words, a width of each of the second blocking dielectric layers 130 in a horizontal direction may increase in proportion to a reduction in width of the first blocking dielectric layer 141 in a horizontal direction.

Generally, in a vertical NAND flash memory device, as the number of terminals increases, a channel hole diameter difference may occur between an upper end and a lower end thereof. Therefore, in terms of a manufacturing process, it may be very difficult to conformally form a gate insulation layer (particularly, an outermost blocking dielectric layer) to have the same width along an inner wall of a channel hole which has a high aspect ratio and a diameter difference. Therefore, the gate insulation layer may be relatively thickly formed in an upper region of the channel hole and may be relatively thinly formed in a lower region of the channel hole. Due to this, a speed difference may occur in reading or writing a program in units of word lines, causing a reduction in reliability of an integrated circuit device.

In order to solve such a problem, the integrated circuit device 10 according to an embodiment may include the second blocking dielectric layer 130 disposed between the conductive line 160 and the first blocking dielectric layer 141, for compensating for a thickness difference of the first blocking dielectric layer 141 occurring in a manufacturing process. Here, the second blocking dielectric layer 130 may be provided to have a width which progressively increases toward the main surface 102M of the substrate 102. That is, in the integrated circuit device 10, a horizontal-direction width for enabling a blocking dielectric layer to perform a function may have a certain numerical value or more all over the plurality of conductive lines 160.

Therefore, in the integrated circuit device 10 according to an embodiment, a speed may be constant in reading or writing a program in units of word lines, thereby enhancing electrical characteristic and/or reliability.

Figure 4:
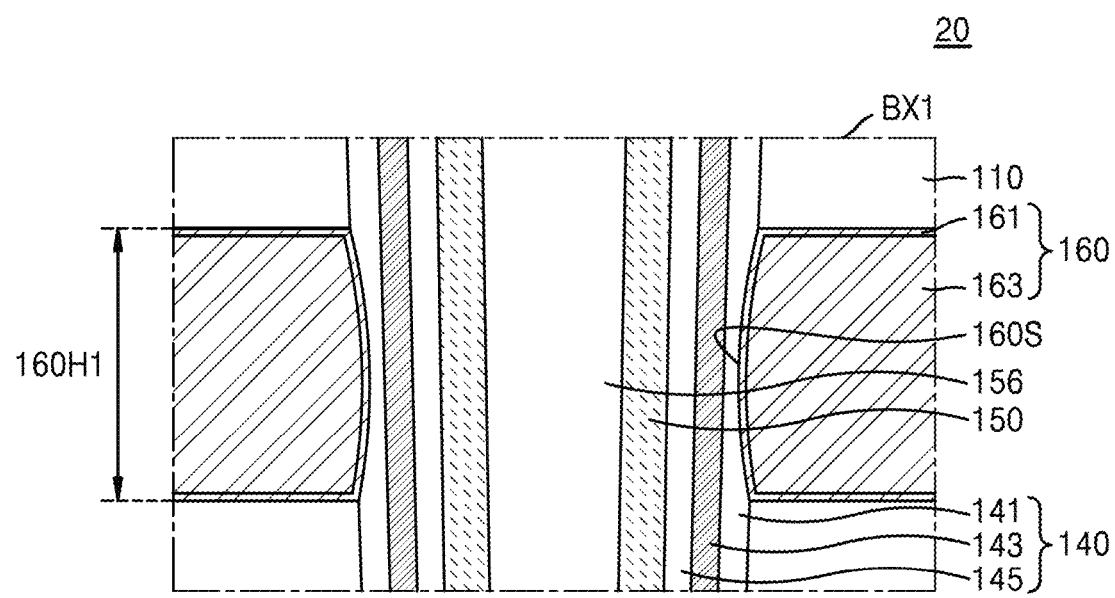
FIGS. 4 to 6 are enlarged cross-sectional views of an integrated circuit device according to an embodiment.
Figure 5:
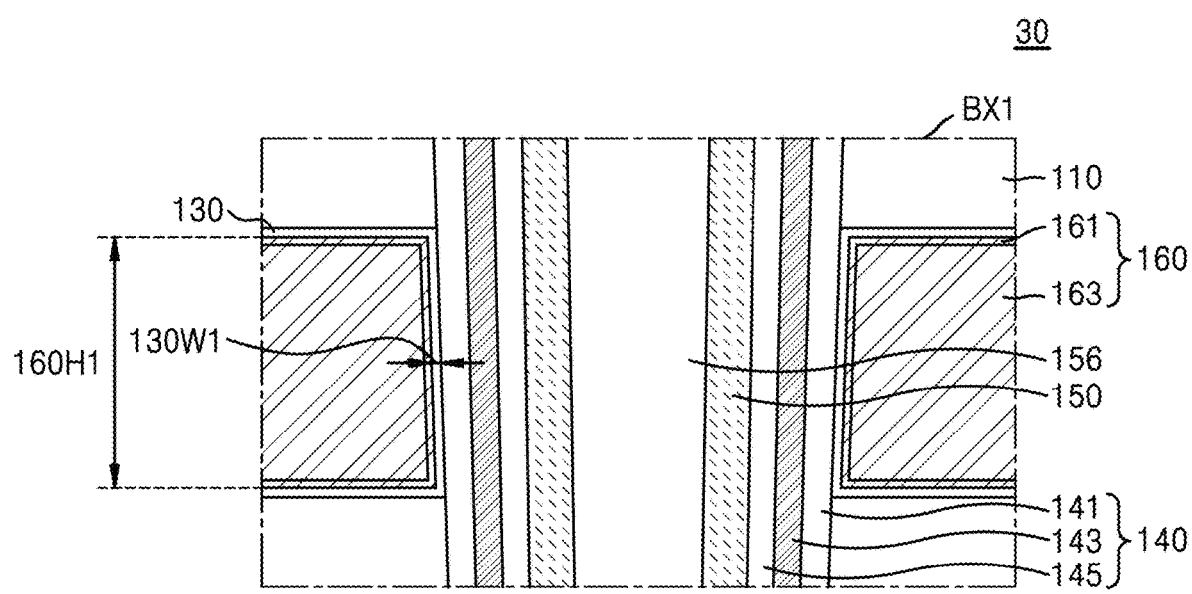
Figure 6:
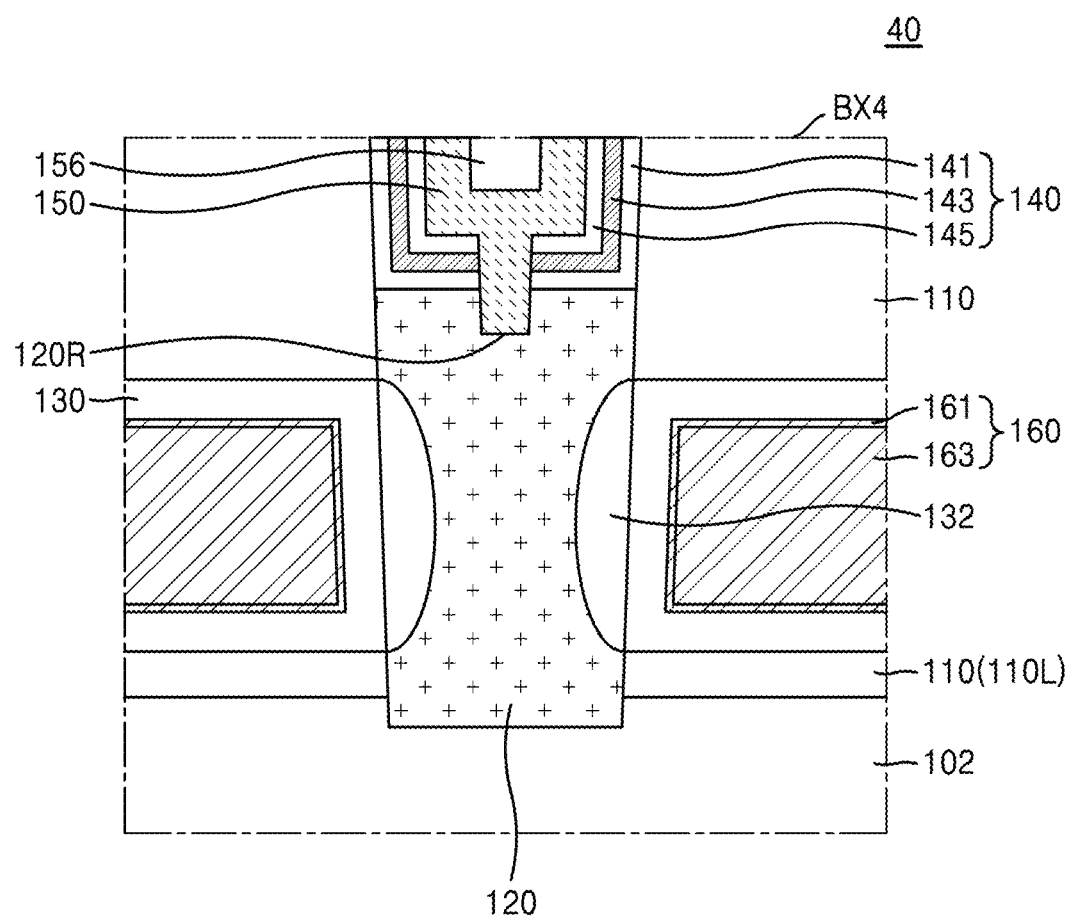

FIGS. 4 to 6 are enlarged cross-sectional views of an integrated circuit device according to an embodiment.

Figure 3E:
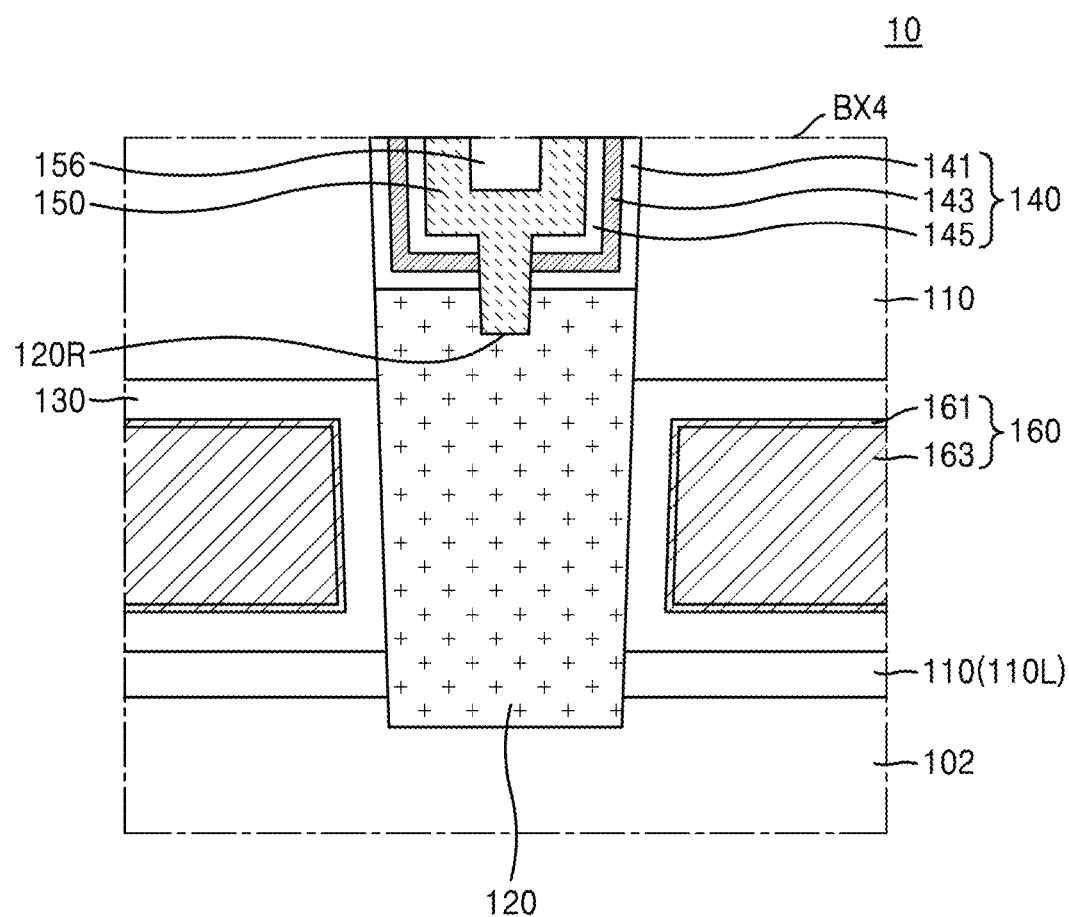

Most elements configuring each of integrated circuit devices 20, 30, and 40 described below and a material included in each of the elements may be substantially the same as or similar to descriptions given above with reference to FIGS. 2 to 3E. Therefore, for convenience of description, differences with the integrated circuit device 10 (see FIG. 3A) described above will be mainly described below.

Referring to FIG. 4, an enlarged cross-sectional surface of a portion corresponding to a dotted-line region BX1 in FIG. 3A is illustrated, and an integrated circuit device 20 according to an embodiment may have mainly the same elements as those of the integrated circuit device 10 illustrated in FIG. 3A.

However, in the integrated circuit device 20, a second blocking dielectric layer 130 may not be provided in a conductive line 160 disposed at an upper end among the plurality of conductive lines 160, and moreover, the conductive line 160 disposed at the upper end may include a sidewall 160S which is inserted into a portion of the first blocking dielectric layer 141 and is convex toward the channel layer 150.

That is, comparing the integrated circuit device 20 with the integrated circuit device 10 illustrated in FIG. 3A, a distance between the conductive line 160 disposed at the upper end and the channel layer 150 may be relatively short.

Referring to FIG. 5, an enlarged cross-sectional surface of a portion corresponding to a dotted-line region BX1 in FIG. 3A is illustrated, and an integrated circuit device 30 according to an embodiment may have mainly the same elements as those of the integrated circuit device 10 illustrated in FIG. 3A.

However, the integrated circuit device 30 may include a plurality of second blocking dielectric layers 130 disposed between the plurality of conductive lines 160 and the first blocking dielectric layer 141, in all of the plurality of conductive lines 160.

That is, each of the second blocking dielectric layers 130 may be disposed to have a first width 130W1 in a conductive line 160 disposed at an upper end among the plurality of conductive lines 160. Here, the first width 130W1 may be less than the second width 130W2 (see FIG. 3C).

Referring to FIG. 6, an enlarged cross-sectional surface of a portion corresponding to a dotted-line region BX4 in FIG. 3A is illustrated, and an integrated circuit device 40 according to an embodiment may have mainly the same elements as those of the integrated circuit device 10 illustrated in FIG. 3A.

However, a gate dielectric layer 132 and the second blocking dielectric layer 130 may be disposed between a semiconductor pattern 120 and a conductive line 160, which are filled into a lowermost end of a channel hole CHH.

That is, the semiconductor pattern 120 and the conductive line 160 may not directly contact each other and may be disposed apart from each other by a certain distance. However, a gate insulation layer 140 may not be provided at the lowermost end of the channel hole CHH where the semiconductor pattern 120 is provided, and thus, the second blocking dielectric layer 130 may not contact a first blocking dielectric layer 141.

Also, the gate dielectric layer 132 may include a sidewall which is inserted into a portion of the semiconductor pattern 120 and is convex.

Figure 7A:
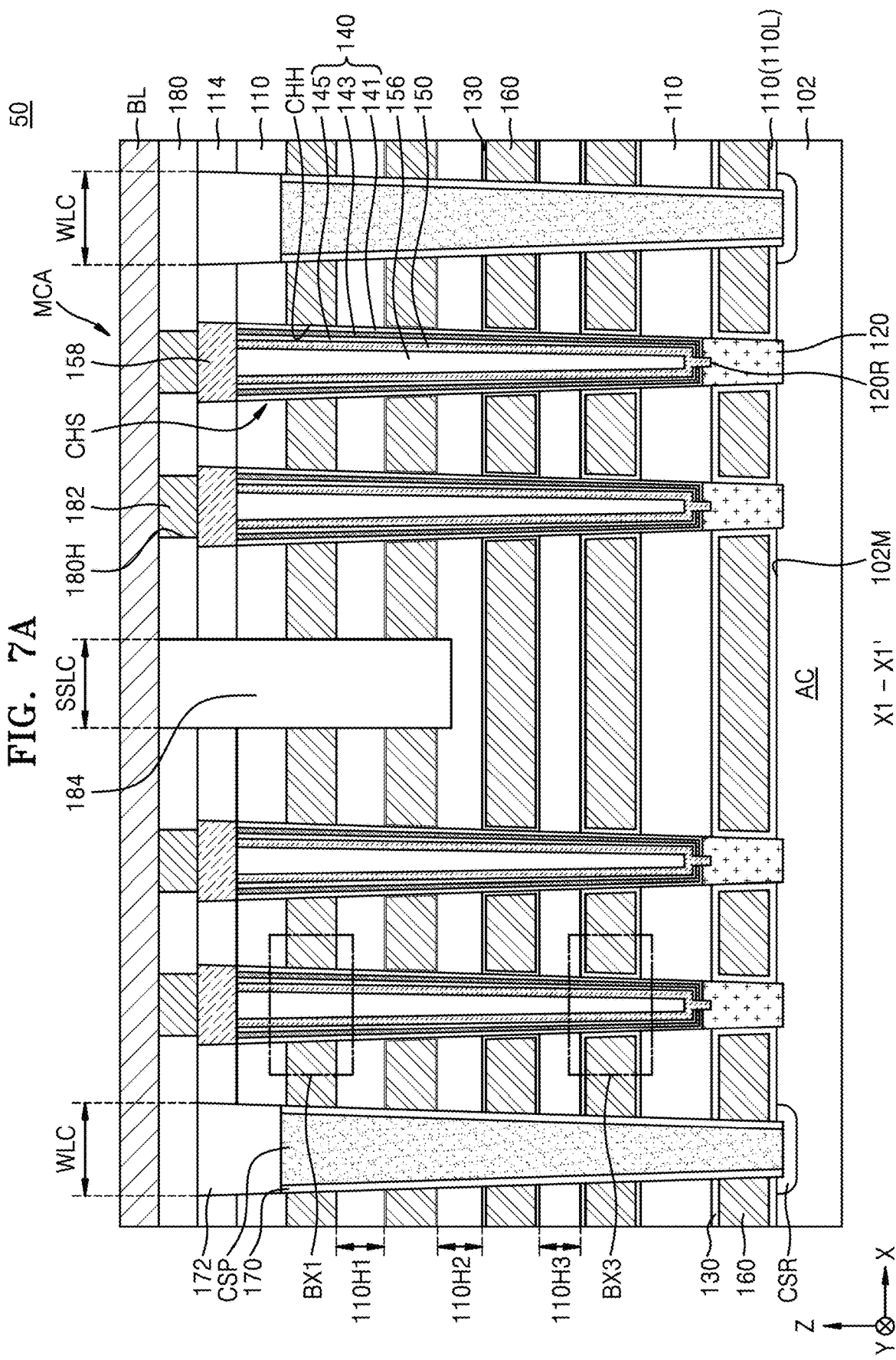
FIG. 7A is a cross-sectional view of an integrated circuit device according to an embodiment.
Figure 7B:
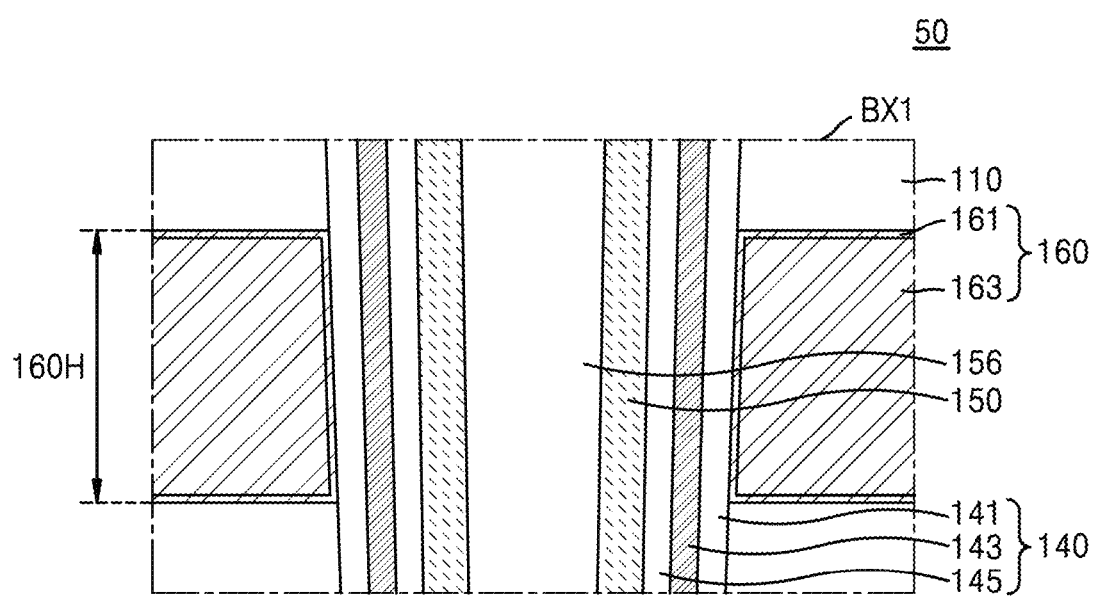
FIGS. 7B and 7C are enlarged cross-sectional views of dotted-line regions BX1 and BX2 of FIG. 7A, respectively.
Figure 7C:
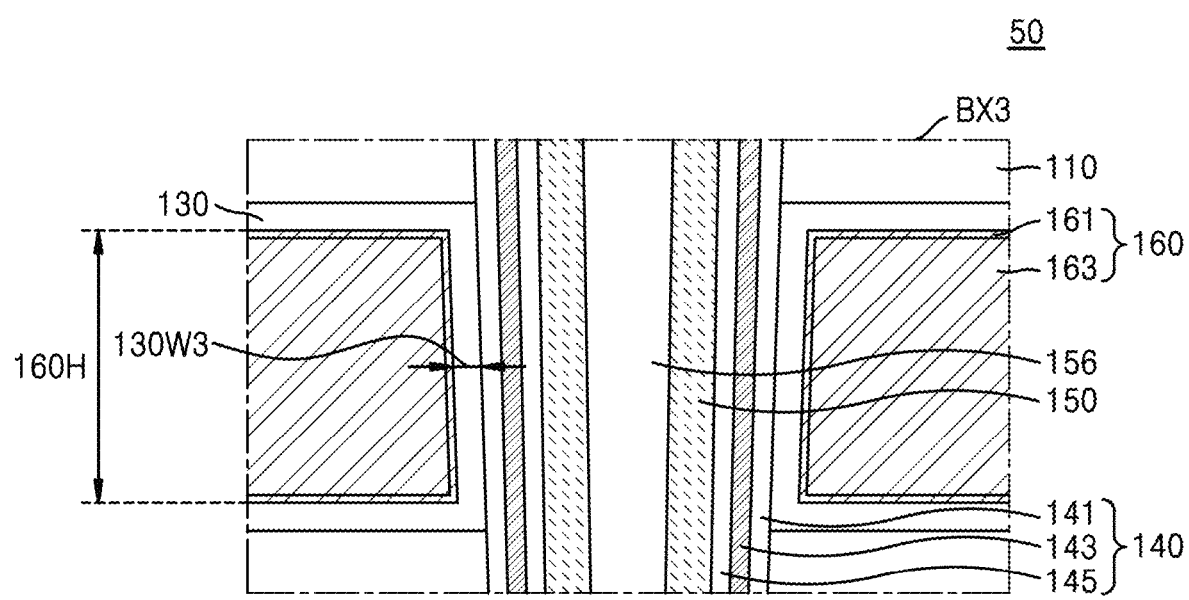

FIG. 7A is a cross-sectional view of an integrated circuit device according to an embodiment, and FIGS. 7B and 7C are enlarged cross-sectional views of dotted-line regions BX1 and BX2 of FIG. 7A, respectively.

Most elements configuring each of an integrated circuit device 50 described below and a material included in each of the elements may be substantially the same as or similar to descriptions given above with reference to FIGS. 2 to 3E. Therefore, for convenience of description, differences with the integrated circuit device 10 (see FIG. 3A) described above will be mainly described below.

Referring to FIGS. 7A to 7C, an integrated circuit device 50 according to an embodiment may have mainly the same elements as those of the integrated circuit device 10 illustrated in FIG. 3A, but thicknesses of a plurality of conductive lines 160 in a vertical direction may be the same in the integrated circuit device 50.

The integrated circuit device 50 may include a plurality of second blocking dielectric layer 130 which are disposed between the plurality of conductive lines 160 and a first blocking dielectric layer 141 and each have a horizontal-direction width increasing toward a Z direction vertical to a main surface 102M of a substrate 102.

Therefore, a sum of a vertical-direction thickness 160H of one conductive line 160 and a vertical-direction thickness of a corresponding second blocking dielectric layer 130 may increase toward the Z direction vertical to the main surface 102M of the substrate 102. On the other hand, a vertical-direction thickness of each of a plurality of insulation layers 110 may decrease toward the Z direction vertical to the main surface 102M of the substrate 102.

In other words, in the plurality of insulation layers 110, an insulation layer 110 disposed at an upper end may have a first thickness 110H1, an insulation layer 110 disposed at a center end may have a second thickness 110H2, and an insulation layer 110 disposed at a lower end may have a third thickness 110H3. Here, the first thickness 110H1 may be greater than the second thickness 110H2, and the second thickness 110H2 may be greater than the third thickness 110H3.

Figure 8A:
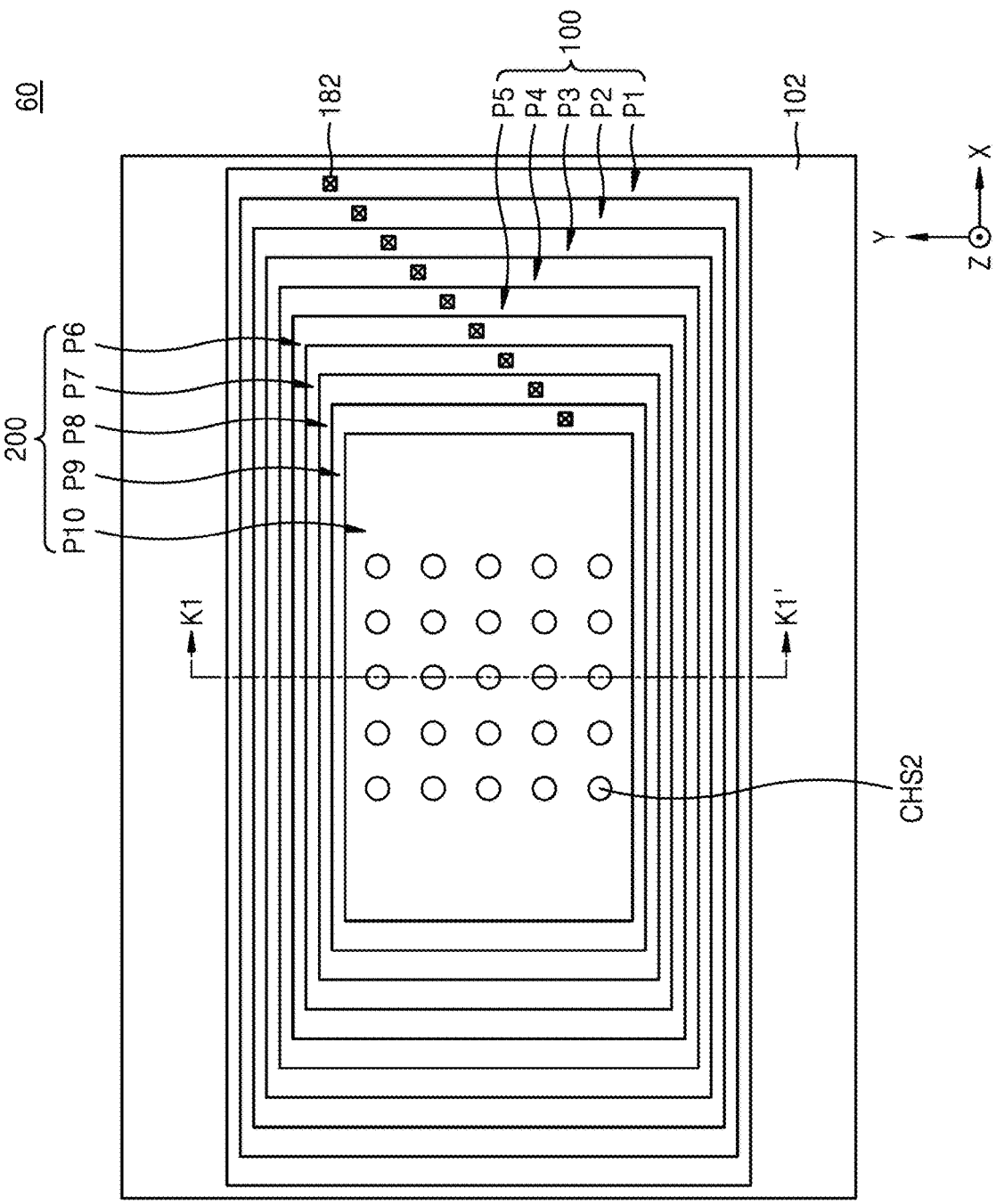
FIG. 8A is a plan view of an integrated circuit device according to an embodiment.
Figure 8B:
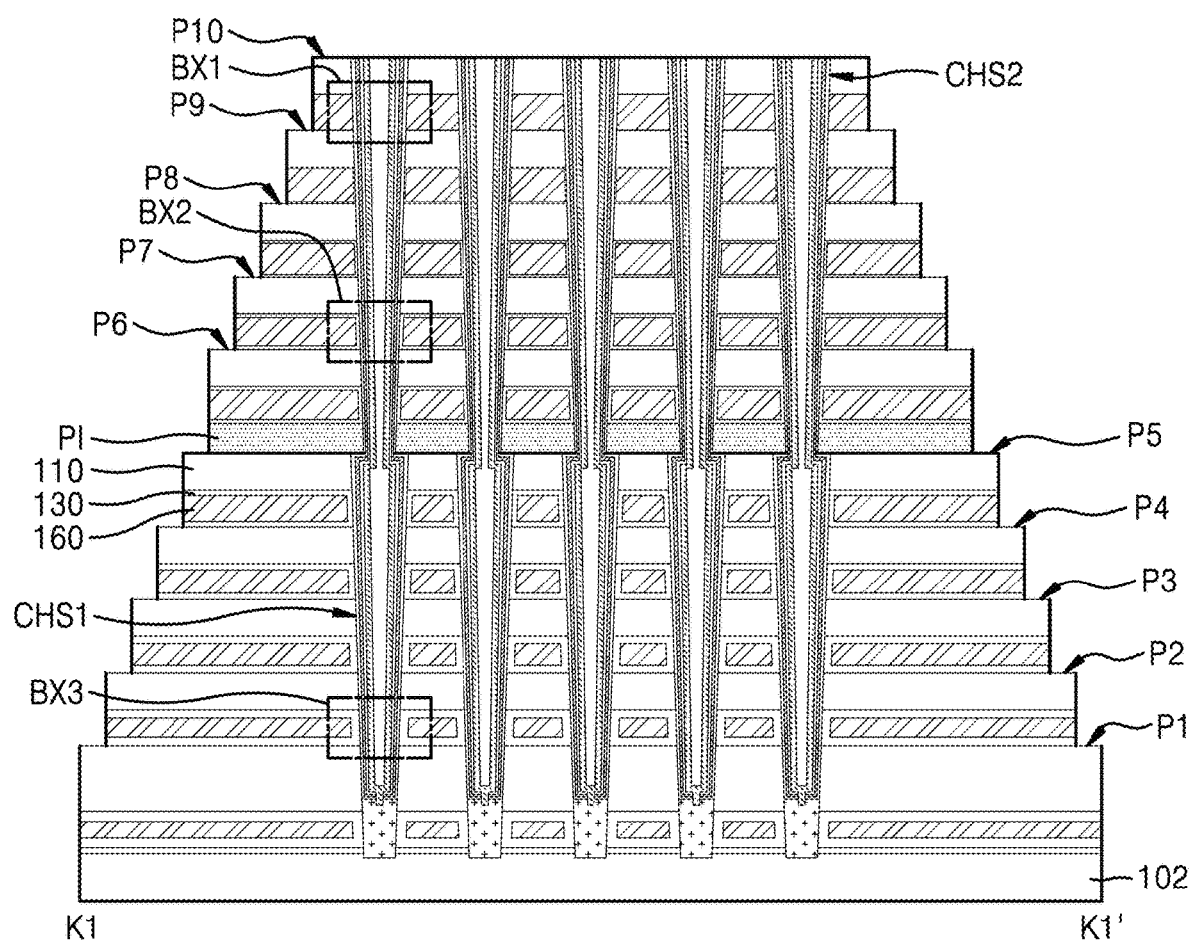
FIG. 8B is a cross-sectional view taken along line K1-K1' of FIG. 8A.
Figure 8C:
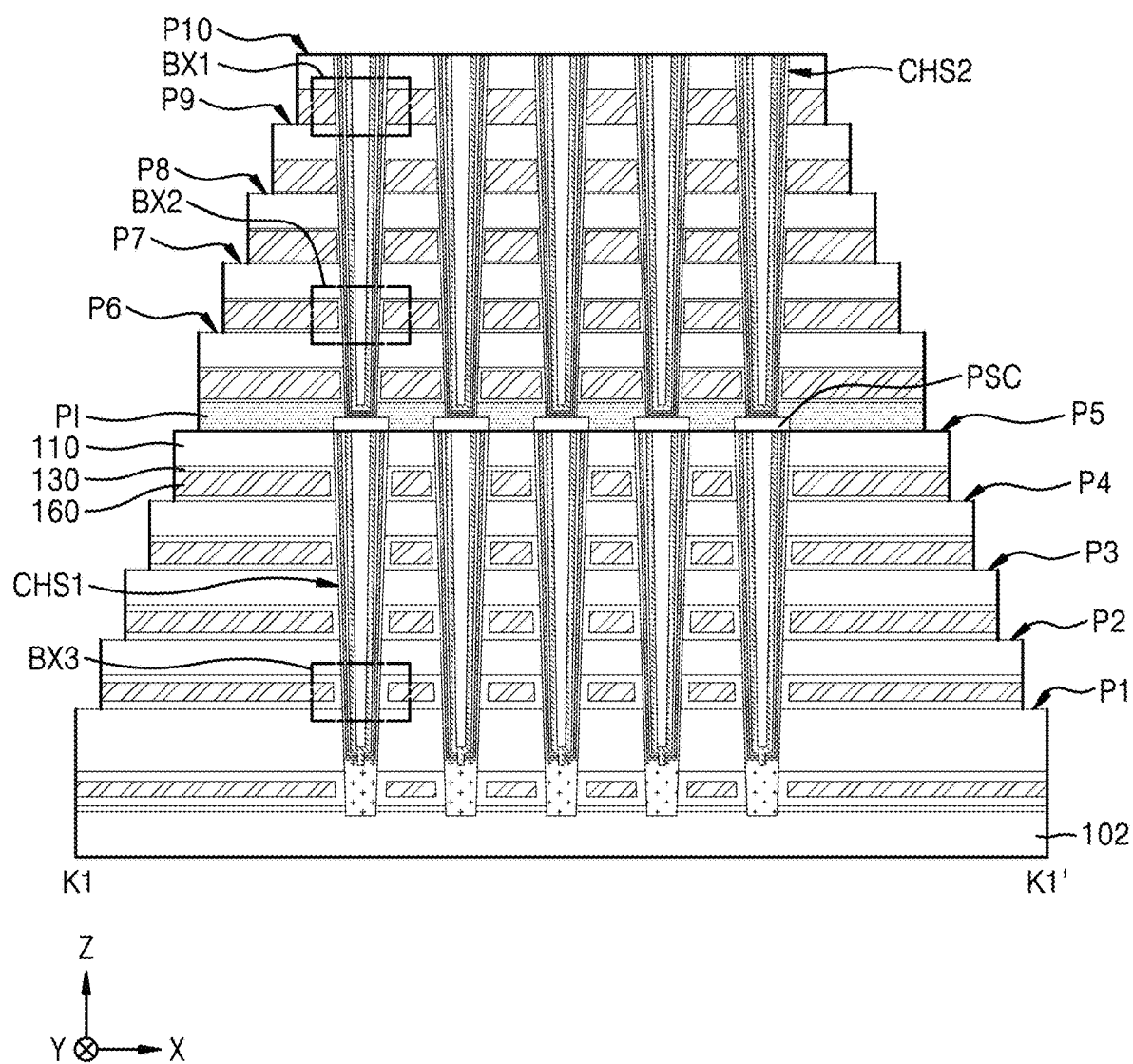
FIG. 8C is a cross-sectional view according to another embodiment taken along line K1-K1' of FIG. 8A.

FIG. 8A is a plan view of an integrated circuit device according to an embodiment, FIG. 8B is a cross-sectional view taken along line K1-K1' of FIG. 8A, and FIG. 8C is a cross-sectional view according to another embodiment taken along line K1-K1' of FIG. 8A.

Most elements configuring each of an integrated circuit device 60 described below and a material included in each of the elements may be substantially the same as or similar to descriptions given above with reference to FIGS. 2 to 3E. Therefore, for convenience of description, differences with the integrated circuit device 10 (see FIG. 3A) described above will be mainly described below.

Referring to FIGS. 8A and 8B, the integrated circuit device 60 may include a first stacked structure 100 and a second stacked structure 200 on the first stacked structure 100.

A long axis of the second stacked structure 200 in a horizontal direction may be provided to be parallel to a long axis of the first stacked structure 100 in a horizontal direction. The first stacked structure 100 and the second stacked structure 200 may be stacked to expose a bit line contact pad 182 of each of the first stacked structure 100 and the second stacked structure 200. A width of the first stacked structure 100 may be greater than that of the second stacked structure 200, in an X-Y direction. A plurality of stacked structures may be stacked so that long axes thereof are parallel to one another. Unlike the illustration, the plurality of stacked structures may have a shape where three or more stacked structures are stacked.

The first stacked structure 100 may include first to fifth conductive line layers P1 to P5, and the second stacked structure 200 may include sixth to tenth conductive lines P6 to P10. However, this is merely an example, and example embodiments are not limited thereto.

Each of the first and second stacked structures 100 and 200 may be substantially the same structure as that of the integrated circuit device 10 (see FIG. 3A) described above. Before the second stacked structure 200 is formed, an interlayer insulation layer PI may be formed on the first stacked structure 100. The interlayer insulation layer PI may cover the insulation layer 110 of the first stacked structure 100. The interlayer insulation layer PI may expose an upper surface of each of a plurality of first channel structures CHS1 through a planarization process.

A plurality of first channel structures CHS1 passing through the first stacked structure 100 and a plurality of second channel structures CHS2 passing through the second stacked structure 200 may be provided. The plurality of second channel structures CHS2 may be provided to be connected to the plurality of first channel structures CHS1. In some embodiments, lower portions of the plurality of second channel structures CHS2 and upper portions of the plurality of first channel structures CHS1 may be provided to overlap one another. Also, a diameter of an uppermost surface of each of the second channel structures CHS2 may be greater than that of a lowermost surface of each of the first channel structures CHS1.

In some embodiments, over the first and second stacked structures 100 and 20, a horizontal-direction width of each of a plurality of second blocking dielectric layers 130 may increase toward a Z direction vertical to a substrate 102.

In the drawings, dotted-line regions BX1 to BX4 may respectively correspond to FIGS. 3B to 3E. That is, in the second stacked structure 200, each of the second blocking dielectric layers 130 may not be provided on a conductive line 160 disposed at an upper end among the plurality of conductive lines 160. In the second stacked structure 200, each of the second blocking dielectric layers 130 may have a second width 130W2 in a conductive line 160 disposed at a center end among the plurality of conductive lines 160. In the first stacked structure 100, each of the second blocking dielectric layers 130 may have a third width 130W3 in a conductive line 160 disposed at a lower end among the plurality of conductive lines 160. Here, the second width 130W2 may be less than the third width 130W3.

Referring to FIGS. 8A and 8C, the integrated circuit device 60 may include the first stacked structure 100 and the second stacked structure 200 on the first stacked structure 100 and may further include a polysilicon capping layer PSC covering an uppermost surface of the first channel structure CHS1.

The polysilicon capping layer PSC may be disposed between the first channel structure CHS1 and the second channel structure CHS2. This may be a result of a process of completely forming the first channel structure CHS1 and then forming the second channel structure CHS2.

FIGS. 9A to 9I are cross-sectional views illustrating a method of manufacturing an integrated circuit device in a process sequence, according to an embodiment.

In some embodiments, a method of manufacturing the integrated circuit device 10 described above with reference to FIGS. 2 to 3E will be described. In FIGS. 9A to 9I, an enlarged cross-sectional surface of a portion corresponding to a dotted-line region 51 of FIG. 3A is illustrated in a process sequence.

Also, a method of manufacturing an integrated circuit device may include process operations. In a case where a certain embodiment is implemented differently, a certain process operation may be performed differently from a described sequence. For example, two processes which are successively described may be substantially and simultaneously performed, or may be performed in a sequence opposite a described sequence.

Figure 9A:
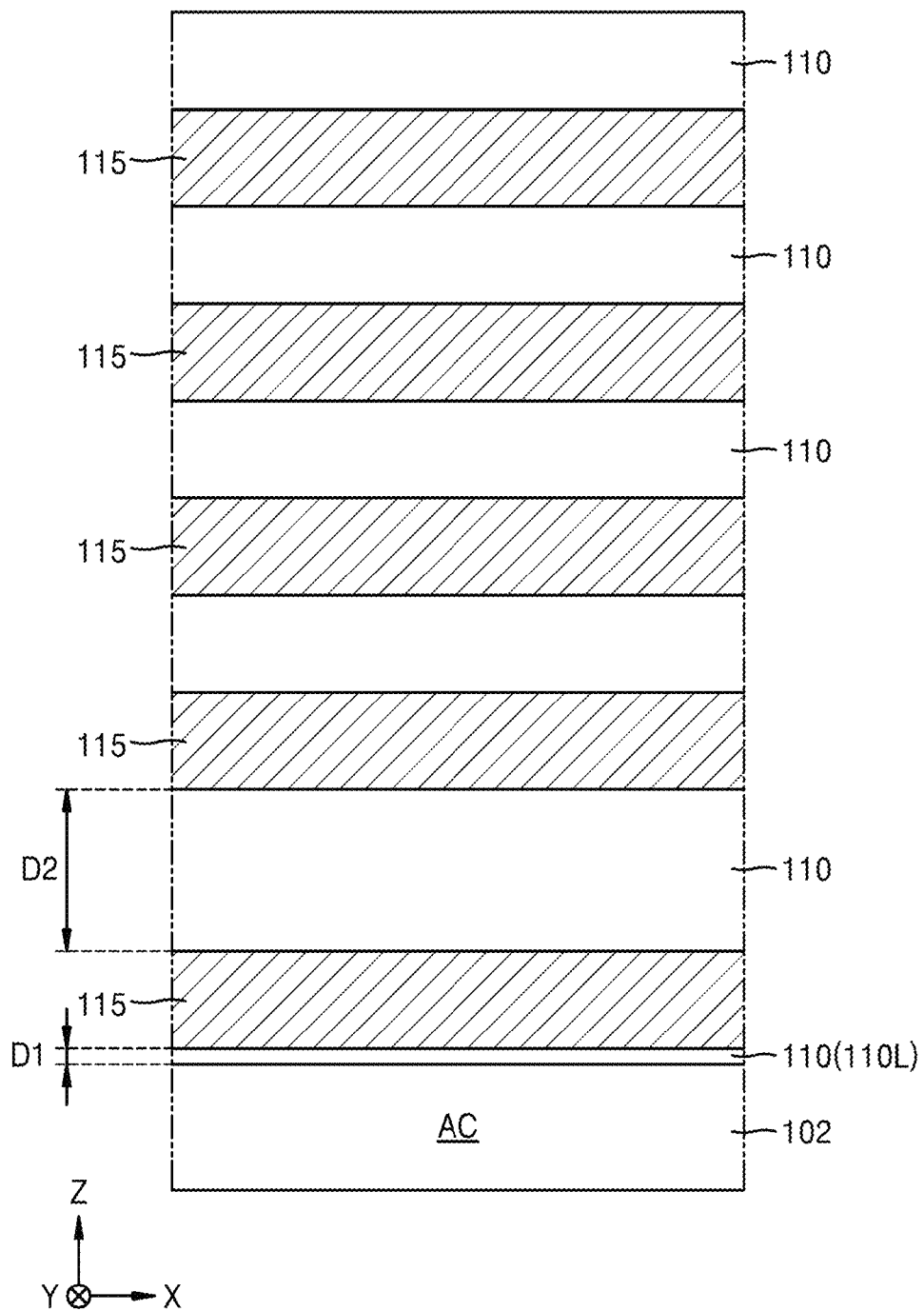
FIGS. 9A to 9I are cross-sectional views illustrating a method of manufacturing an integrated circuit device in a process sequence, according to an embodiment.

Referring to FIG. 9A, an active region AC may be defined in a substrate 102, and a plurality of insulation layers 110 and a plurality of sacrificial layers 115 may be alternately stacked one by one on the substrate 102.

A lowermost insulation layer 110L contacting the substrate 102 among the plurality of insulation layers 110 may have a thickness D1, which is less than that of another insulation layer 110. The plurality of insulation layers 110 may each include silicon oxide, and the plurality of sacrificial layers 115 may each include silicon nitride.

Each of the plurality of sacrificial layers 115 may provide a space for forming a ground selection line GSL, a plurality of word lines WL, and a plurality of string selection lines SSL in a subsequent process. A first sacrificial layer 115 first from the substrate 102 among the plurality of sacrificial layers 115 may provide a space for forming the ground selection line GSL. An insulation layer 110 contacting an upper surface of the first sacrificial layer 115 of the plurality of insulation layers 110 may have a thickness D2 which is greater than that of another insulation layer 110. Each of the plurality of insulation layers 110 and the plurality of sacrificial layers 115 may be formed through a chemical vapor deposition (CVD) process, a plasma enhanced CVD (PECVD) process, or an atomic layer deposition (ALD) process.

Figure 9B:
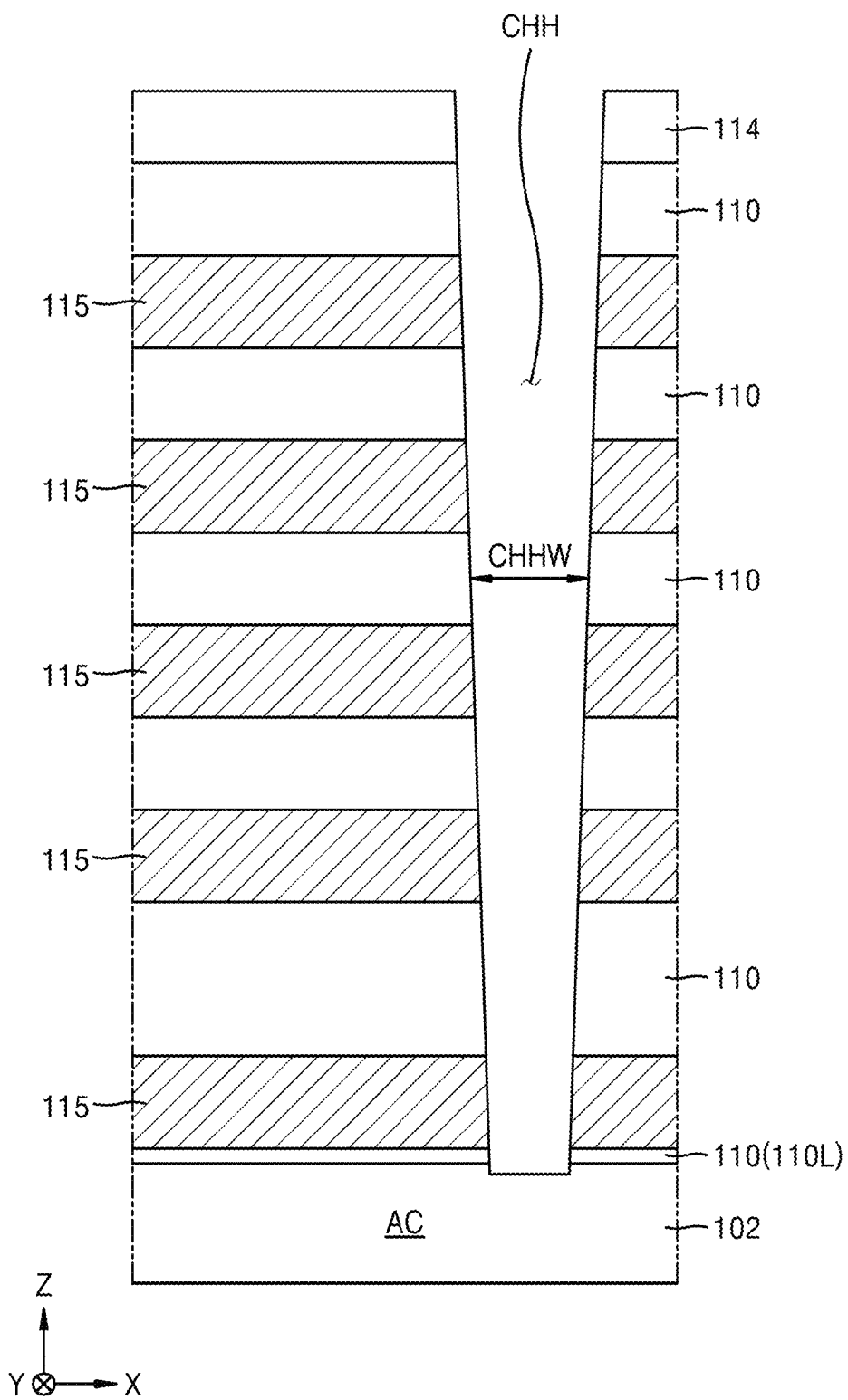

Referring to FIG. 9B, an insulation pattern 114 may be formed on an uppermost insulation layer 110 of the plurality of insulation layers 110, and then, the plurality of insulation layers 110 and the plurality of sacrificial layers 115 may be etched by using the insulation pattern 114 as an etch mask, thereby forming a channel hole CHH exposing the substrate 102.

A horizontal-direction width CHHW of the channel hole CHH may have a tapered shape which is reduced toward the substrate 102. The insulation pattern 114 may include a single layer or a multilayer including oxide, nitride, or a combination thereof.

Figure 9C:
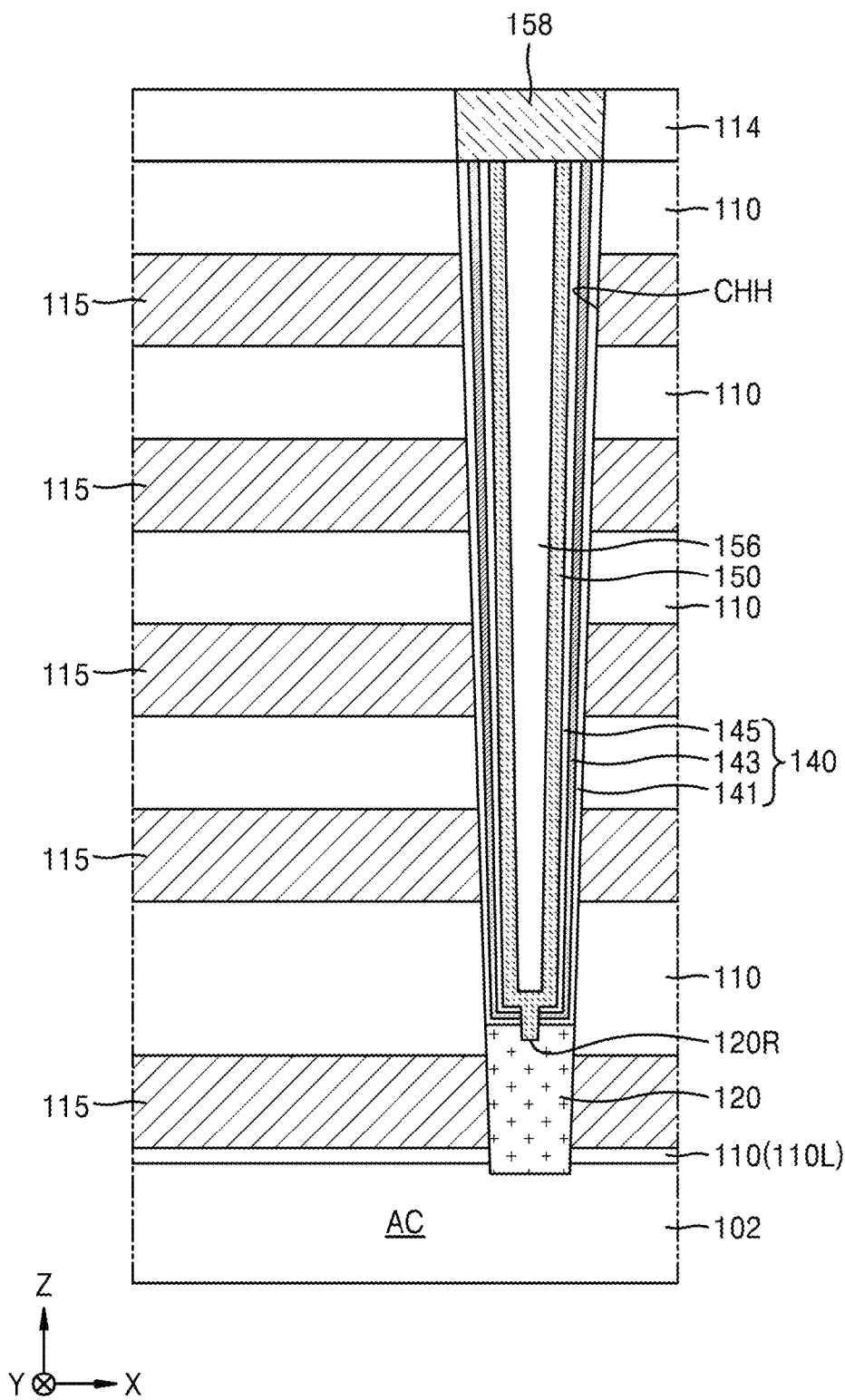

Referring to FIG. 9C, a semiconductor pattern 120 may be partially filled into the channel hole CHH, and then, a gate insulation layer 140, a channel layer 150, and a buried insulation layer 156 may be sequentially formed and a drain region 158 filled into an upper portion of an inlet of the channel hole CHH may be formed.

The gate insulation layer 140 may include a first blocking dielectric layer 141, a charge storage layer 143, and a tunneling dielectric layer 145. Each of the gate insulation layer 140 and the channel layer 150 may have a cylinder shape in the channel hole CHH. Some embodiments, in a process of forming the channel layer 150, a partial region of an upper surface of the semiconductor pattern 120 may be removed to pass through the gate insulation layer 140, and thus, a recessed surface 120R may be formed on the upper surface of the semiconductor pattern 120. Therefore, the channel layer 150 may contact the recessed surface 120R of the semiconductor pattern 120.

A deposition process and an etch back process may be repeatedly performed for forming the first blocking dielectric layer 141, the charge storage layer 143, the tunneling dielectric layer 145, the channel layer 150, and the buried insulation layer 156. The deposition process may be performed as a CVD process, a low pressure CVD (LPCVD) process, or an ALD process.

The first blocking dielectric layer 141 may include silicon oxide, the charge storage layer 143 may include silicon nitride, and the tunneling dielectric layer 145 may include silicon oxynitride. That is, the gate insulation layer 140 may be provided in an oxide-nitride-oxide (ONO) structure.

The channel layer 150 may include doped polysilicon or undoped polysilicon. The buried insulation layer 156 may include silicon oxide, silicon nitride, silicon oxynitride, or a combination thereof. The drain region 158 may include doped polysilicon, metal, conductive metal nitride, or a combination thereof.

Figure 9D:
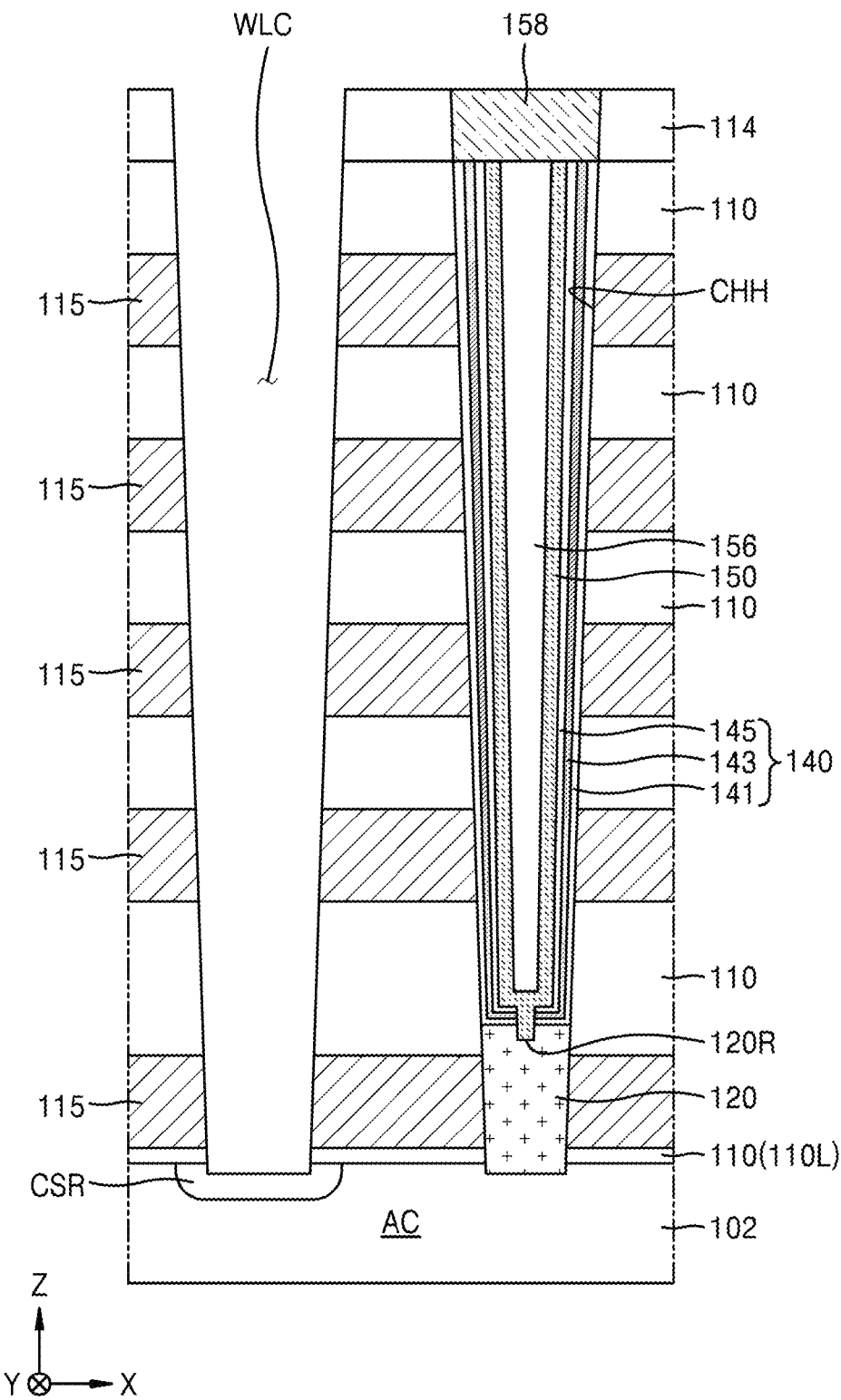

Referring to FIG. 9D, a word line cut region WLC which passes through the insulation pattern 114, the plurality of insulation layers 110, and the plurality of sacrificial layers 115 to expose the substrate 102 may be formed by etching the insulation pattern 114, the plurality of insulation layers 110, and the plurality of sacrificial layers 115, and then, a common source region CSR may be formed by injecting an impurity ion into the substrate 102 through the word line cut region WLC.

Figure 9E:
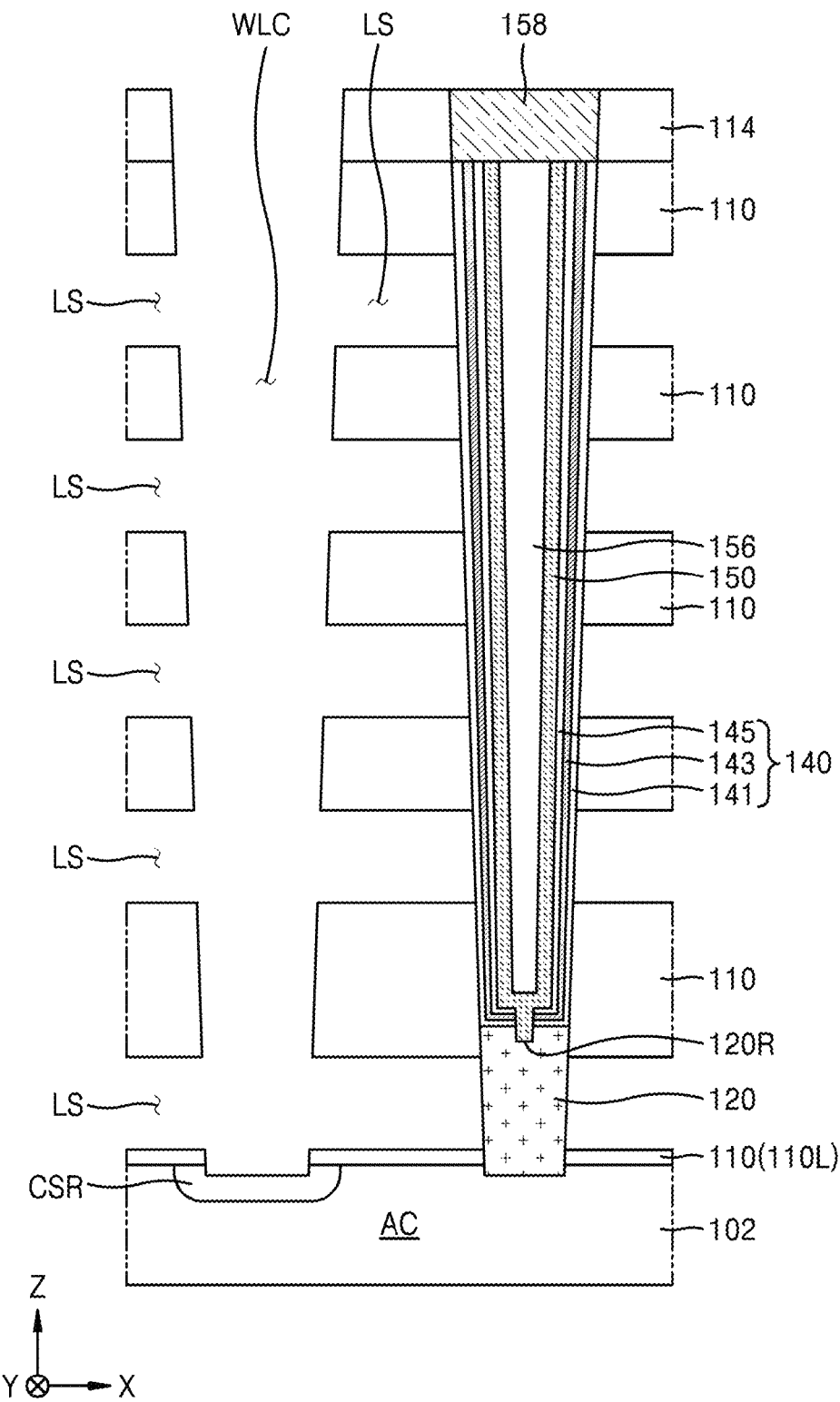

Referring to FIG. 9E, a plurality of conductive line spaces LS may be formed by removing the plurality of sacrificial layers 115 through the word line cut region WLC.

The plurality of sacrificial layers 115 may be selectively removed through a wet etch process, and thus, the plurality of conductive line spaces LS may be provided between the insulation layers 110. A portion of the gate insulation layer 140 may be exposed through each of the plurality of conductive line spaces LS.

A process of forming the plurality of conductive line spaces LS may include a process of horizontally etching the plurality of sacrificial layers 115 by using an etch recipe having an etch selectivity with respect to the insulation layers 110. For example, when the plurality of sacrificial layers 115 include silicon nitride and the insulation layers 110 include silicon oxide, a horizontal etch process may be performed by using an etch solution including phosphoric acid.

Figure 9F:
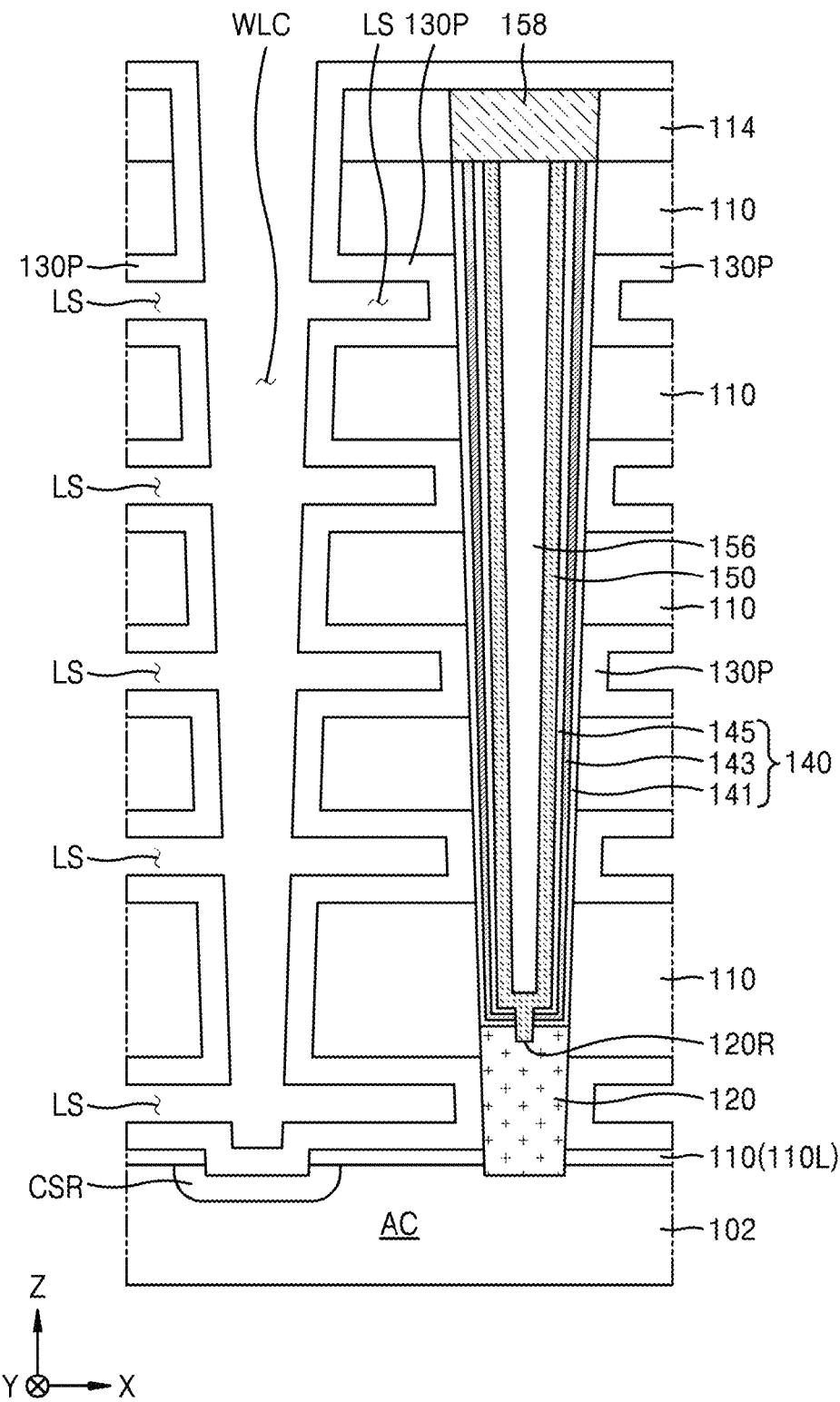

Referring to FIG. 9F, a second blocking preliminary dielectric layer 130P filled into each of the conductive line spaces LS may be formed on a resultant material of FIG. 9E.

The second blocking preliminary dielectric layer 130P may be formed to fill the conductive line spaces LS and to conformally cover surfaces exposed through the conductive line spaces LS and the word line cut region WLC. An ALD process, a CVD process, or a plasma oxidization process may be used for forming the second blocking preliminary dielectric layer 130P.

In some embodiments, the second blocking preliminary dielectric layer 130P may be formed to have substantially the same thickness in different conductive line spaces LS by using a process (for example, an ALD process) where step coverage is relatively uniform.

Figure 9G:
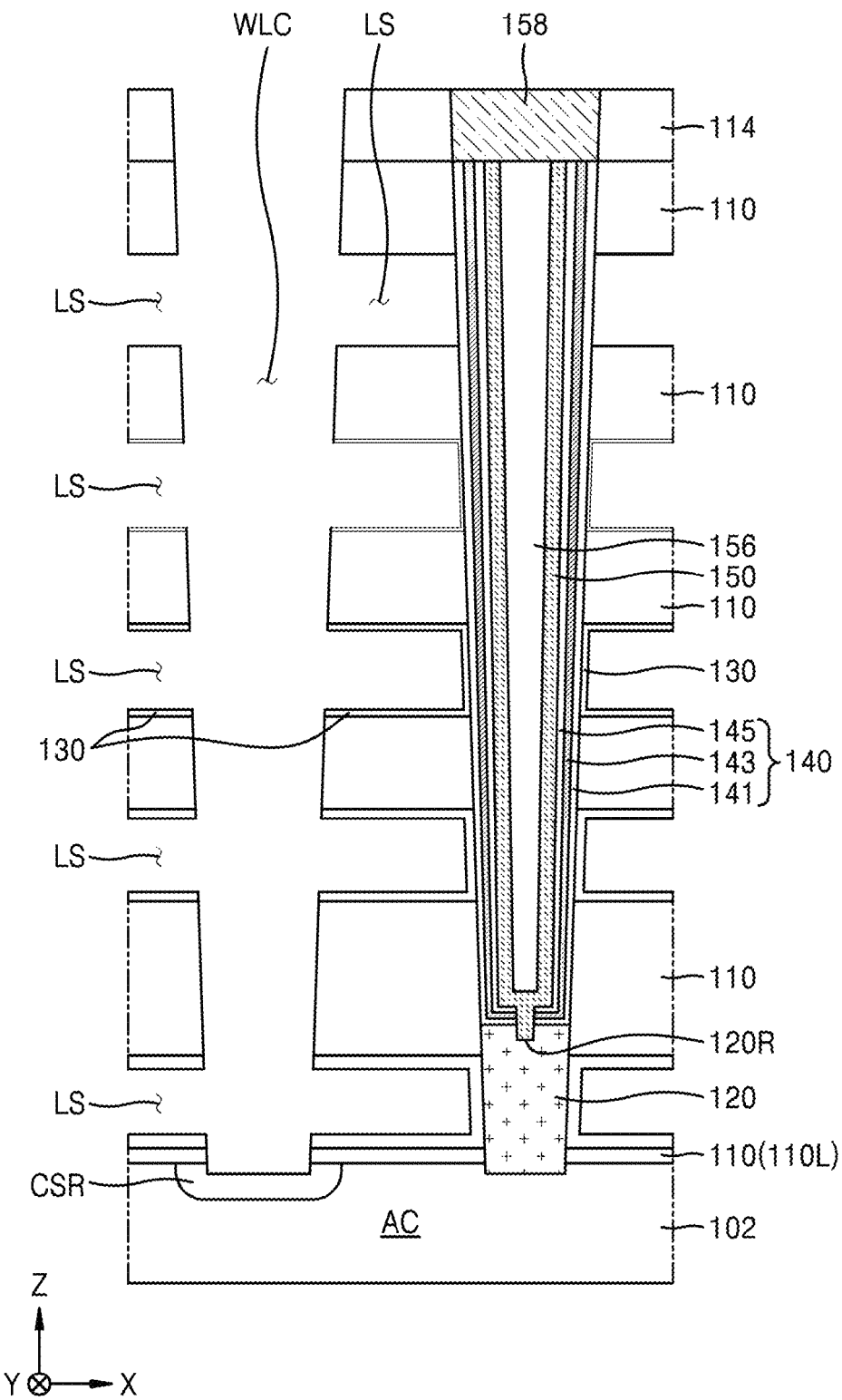

Referring to FIG. 9G, a second blocking dielectric layer 130 having a certain thickness may be formed in each of the conductive line spaces LS by performing a wet etch process of removing a portion of the second blocking preliminary dielectric layer 130P (see FIG. 9F).

In some embodiments, a plurality of second blocking dielectric layers 130 may be formed to have different thicknesses in different conductive line spaces LS by differently etching the second blocking preliminary dielectric layer 130P (see FIG. 9F) through an etch process (for example, a wet etch process) where an etch distribution is relatively non-uniform.

An etch solution applied to the wet etch process may penetrate in a direction from a far position to a close position with respect to the substrate 102, and thus, a horizontal-direction width of each of the plurality of second blocking dielectric layers 130 may increase toward a Z direction vertical to the substrate 102.

The plurality of second blocking dielectric layers 130 may be provided in at least some of the plurality of conductive line spaces LS. That is, in some embodiments, the second blocking dielectric layers 130 may not be provided in a conductive line space LS disposed at an upper end among the plurality of conductive line spaces LS.

Figure 9H:
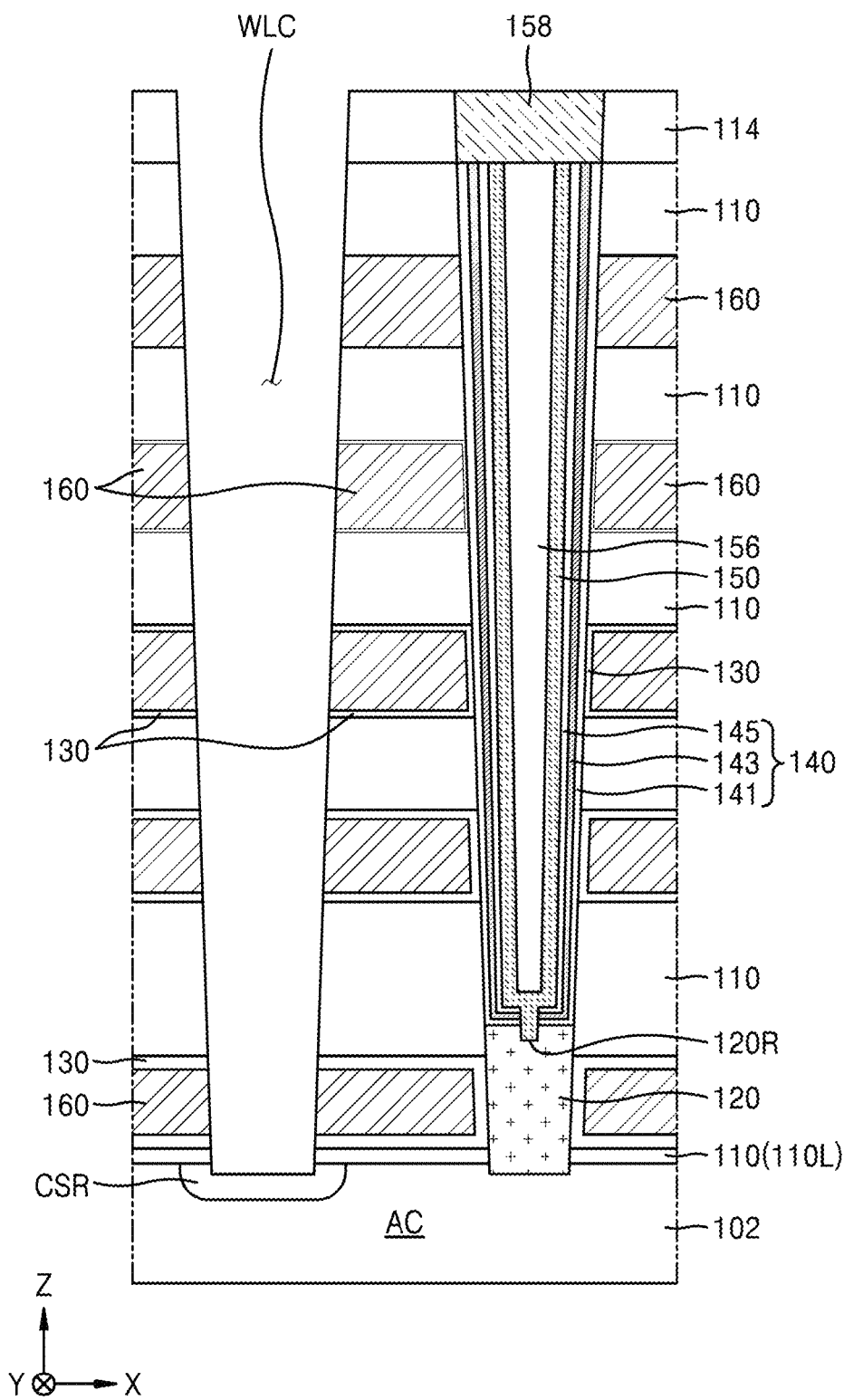

Referring to FIG. 9H, a plurality of conductive lines 160 respectively filled into the plurality of conductive line spaces LS (see FIG. 9G) may be formed.

To this end, a space limited by the second blocking dielectric layer 130 among the plurality of conductive line spaces LS (see FIG. 9G) may be filled with a liner conductive layer and a center conductive layer through a plurality of word line cut regions WLC. The center conductive layer may include, for example, tungsten. A sidewall, a lower surface, and an upper surface of each of the conductive lines 160 may be covered by the second blocking dielectric layer 130 in a corresponding conductive line space LS (see FIG. 9G). Also, the conductive lines 160 may be formed in the other conductive line spaces LS (see FIG. 9G).

Figure 9I:
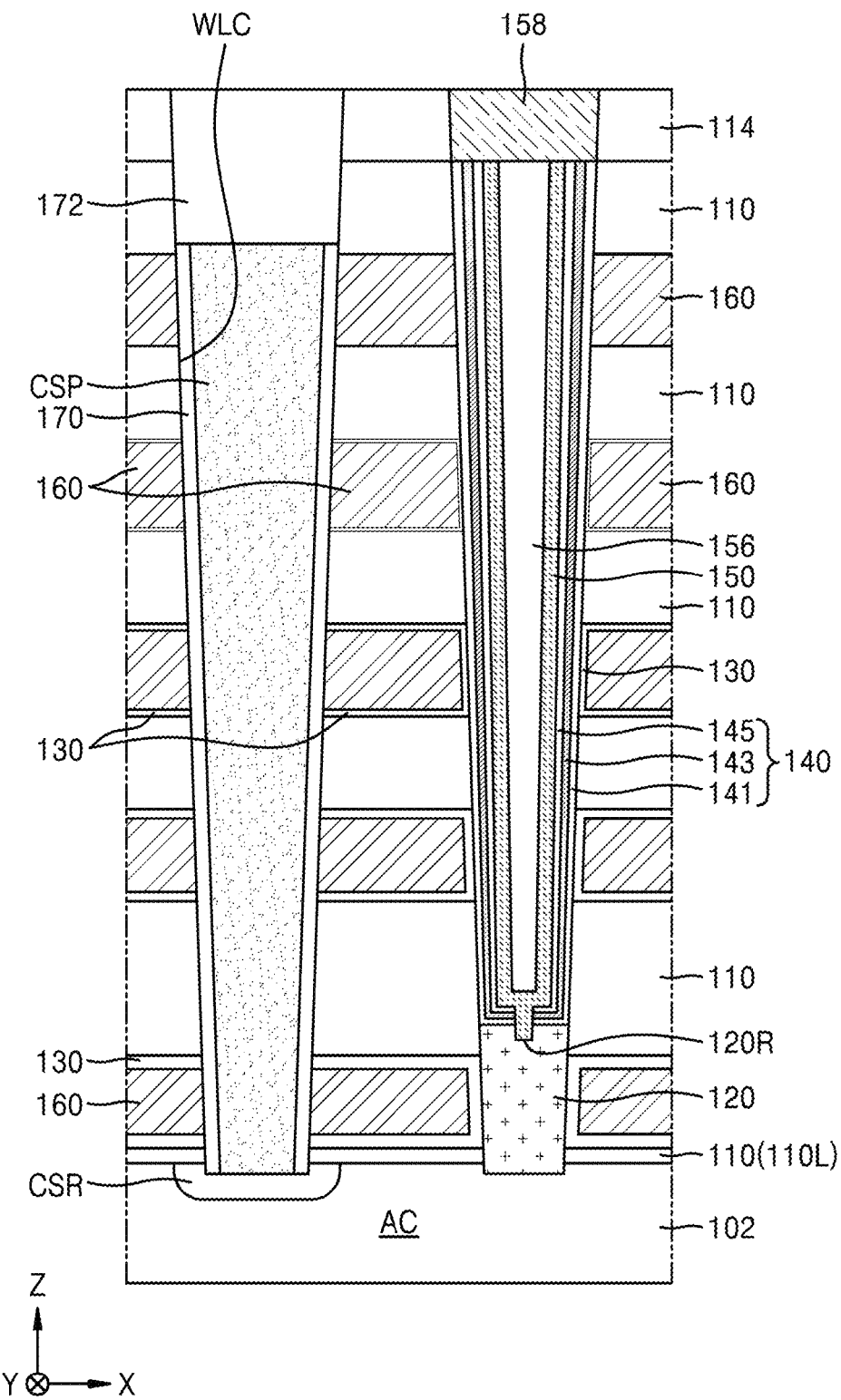

Referring to FIG. 9I, an insulation spacer 170, a common source pattern CSP, and a capping insulation layer 172 may be formed in each of the word line cut regions WLC.

In some embodiments, in order to form the insulation spacer 170 in each of the word line cut regions WLC, a spacer insulation layer covering an inner wall of each word line cut region WLC may be first formed. Subsequently, by performing an etch back process on the spacer insulation layer to expose the common source region CSR in a lower surface of each word line cut region WLC, the insulation spacer 170 may remain on an inner sidewall of each word line cut region WLC.

In order to form the common source pattern CSP, a conductive material may be formed inside and outside each word line cut region WLC so that a space limited by the insulation spacer 170 in each word line cut region WLC is filled with a conductive material, and then, an undesired portion of the conductive material may be removed by a chemical mechanical polishing (CMP) process or an etch back process.

In order to form the capping insulation layer 172, an insulating material filled into a remaining space of each word line cut region WLC may be formed on a resultant material where the insulation spacer 170 and the common source pattern CSP are formed, and then, an upper surface of the insulation pattern 114 or an upper surface of the drain region 158 may be exposed by removing a portion of the insulating material through a CMP process or an etch back process.

Subsequently, as illustrated in FIG. 3A, an insulation layer 180 covering the insulation pattern 114, the drain region 158, and the capping insulation layer 172 may be formed, and a string selection line cut region SSLC may be formed by removing a portion of the insulation layer 180, a portion of the insulation pattern 114, a portion of the insulation layer 110, a portion of each of two upper word lines WL of the plurality of word lines WL. Also, the string selection line cut region SSLC may be filled with the insulation layer 184.

Finally, a plurality of bit line contact holes 180H passing through some regions of the insulation layer 180 may be formed, a conductive material may be buried into the plurality of bit line contact holes 180H to form a plurality of bit line contact pads 182, and a plurality of bit lines BL connected to the plurality of bit line contact pads 182 may be formed on the insulation layer 180, thereby manufacturing the integrated circuit device 10 illustrated in FIG. 3A.

Figure 10A:
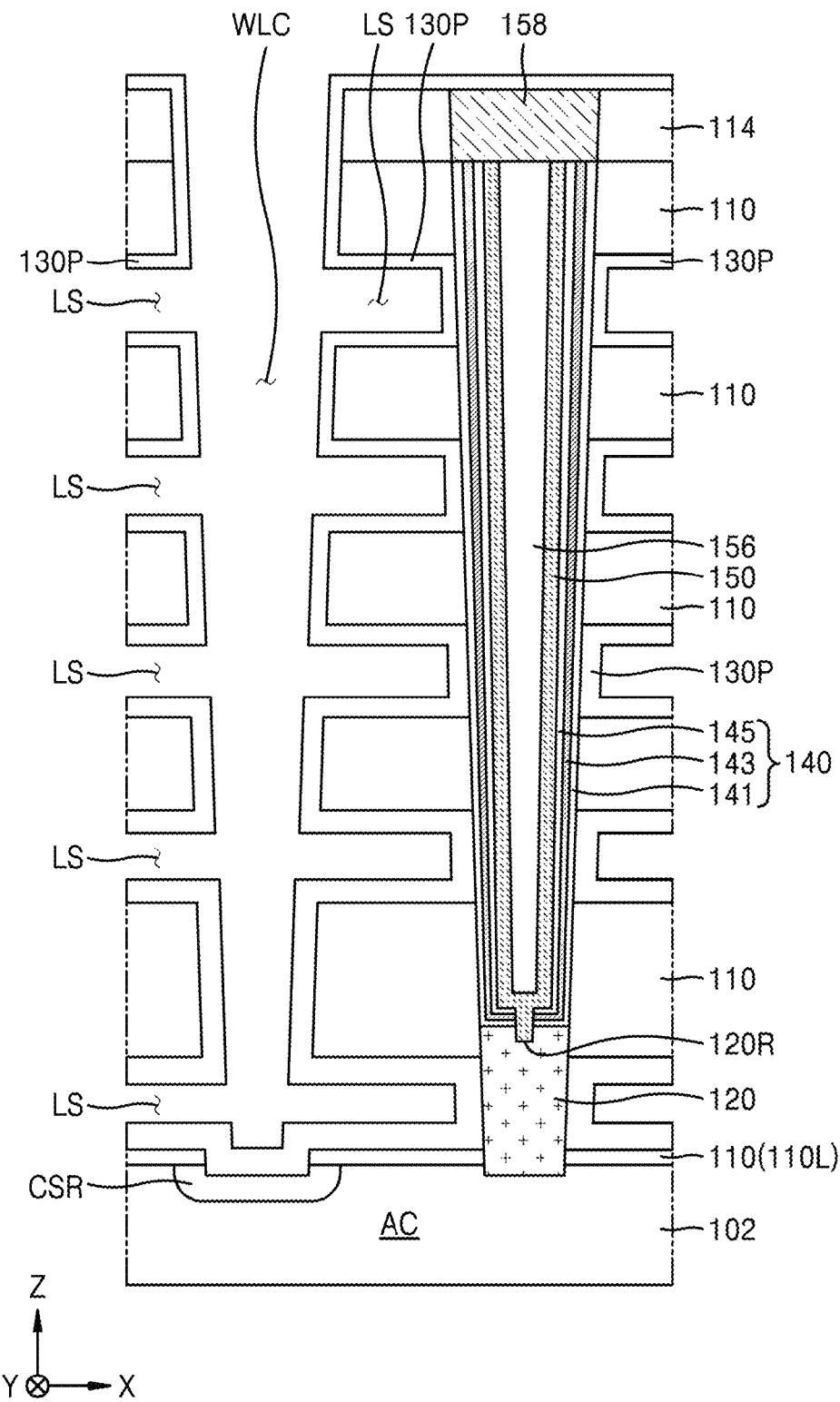
FIGS. 10A to 10C are cross-sectional views illustrating a method of manufacturing an integrated circuit device in a process sequence, according to an embodiment.
Figure 10B:
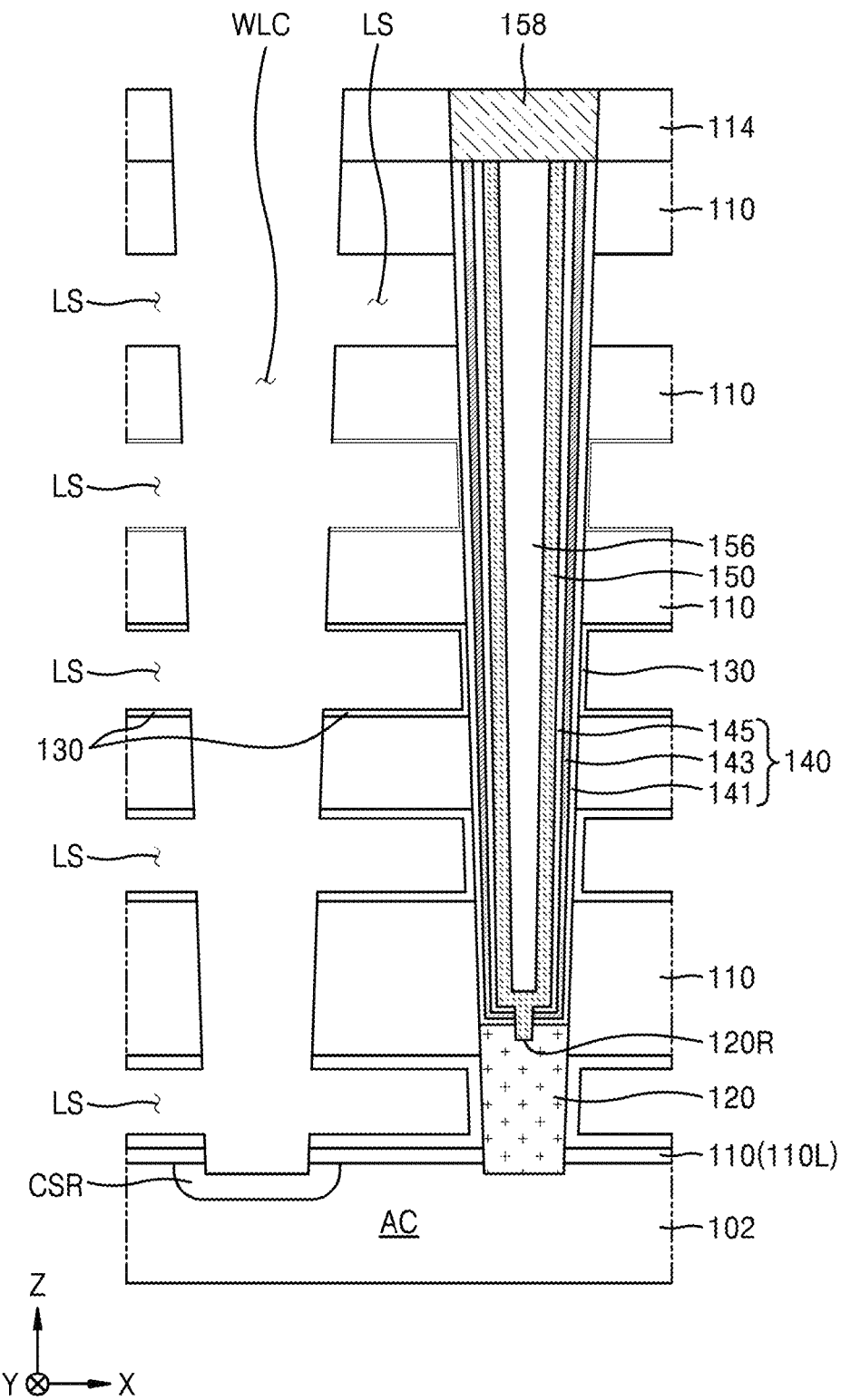
Figure 10C:
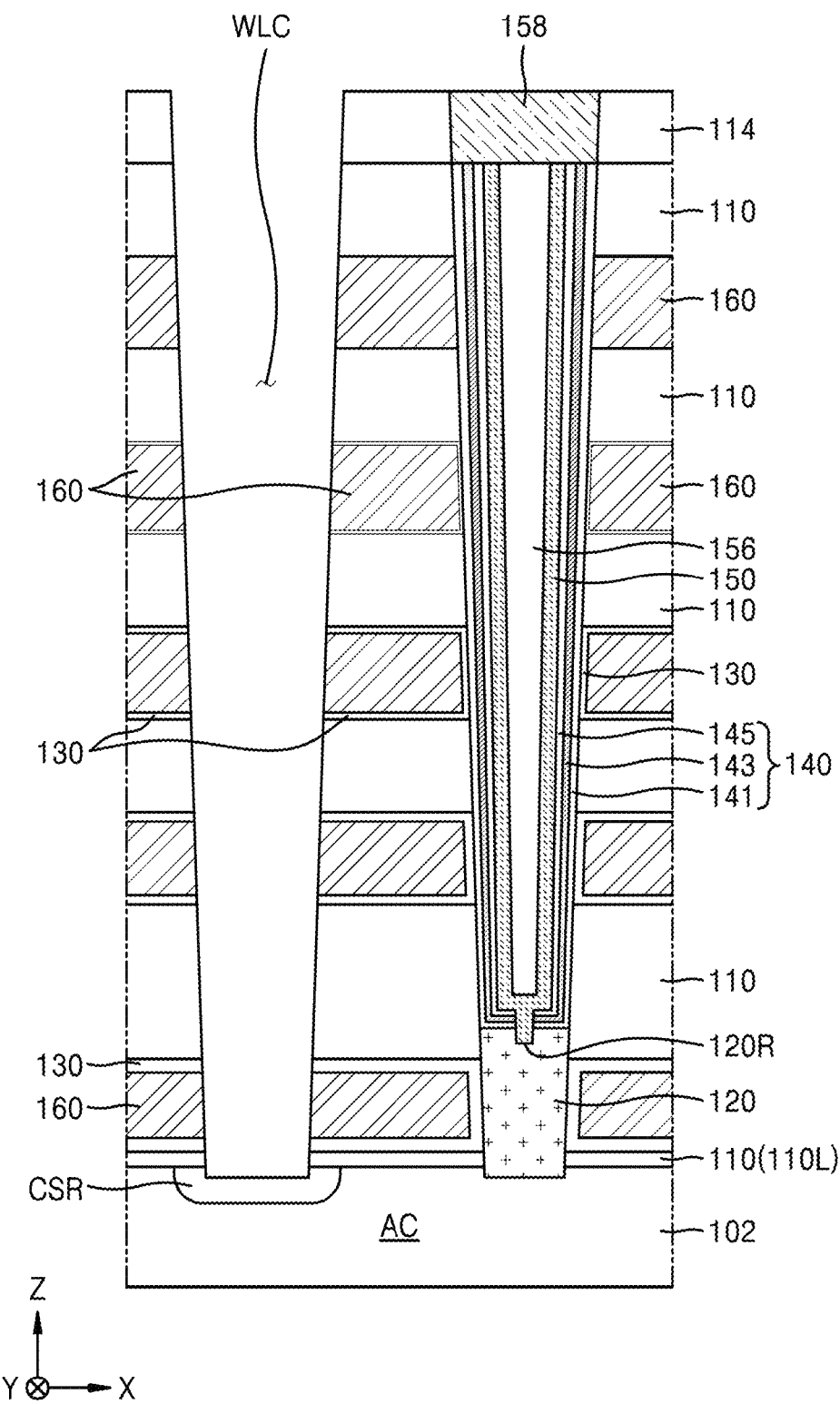

FIGS. 10A to 10C are cross-sectional views illustrating a method of manufacturing an integrated circuit device in a process sequence, according to an embodiment.

Most manufacturing processes included in a method of manufacturing an integrated circuit device described below may be substantially the same as or similar to descriptions given above with reference to FIGS. 9A to 9I. However, there may be a difference in a method of forming a second blocking dielectric layer 130. Therefore, for convenience of description, differences with the method of manufacturing an integrated circuit device described above will be mainly described below.

Referring to FIG. 10A, a second blocking preliminary dielectric layer 130P filled into a conductive line space LS may be formed on a resultant material of FIG. 9E.

The second blocking preliminary dielectric layer 130P may be formed to fill the conductive line space LS and to conformally cover surfaces exposed through the conductive line space LS and a word line cut region WLC. An ALD process, a CVD process, or a plasma oxidization process may be used for forming the second blocking preliminary dielectric layer 130P.

In some embodiments, the second blocking preliminary dielectric layer 130P may be formed to have different thicknesses in different conductive line spaces LS by using a process (for example, a plasma oxidization process) where step coverage is relatively non-uniform.

Referring to FIG. 10B, a second blocking dielectric layer 130 having a certain thickness may be formed in the conductive line space LS by performing a dry etch process of removing a portion of the second blocking preliminary dielectric layer 130P (see FIG. 10A).

In some embodiments, a plurality of second blocking dielectric layers 130 may be formed to have different thicknesses in different conductive line spaces LS by substantially equally etching the second blocking preliminary dielectric layer 130P (see FIG. 9F) through an etch process (for example, a wet etch process) where an etch distribution is relatively uniform.

An etch gas applied to the dry etch process may equally penetrate regardless of a distance in the substrate 102, and thus, a horizontal-direction width of each of the plurality of second blocking dielectric layers 130 may increase toward a Z direction vertical to the substrate 102.

The plurality of second blocking dielectric layers 130 may be provided in at least some of the plurality of conductive line spaces LS. That is, in some embodiments, the second blocking dielectric layers 130 may not be provided in a conductive line space LS disposed at an upper end among the plurality of conductive line spaces LS.

Referring to FIG. 10C, a plurality of conductive lines 160 respectively filled into the plurality of conductive line spaces LS (see FIG. 10B) may be formed.

To this end, a space limited by the second blocking dielectric layer 130 among the plurality of conductive line spaces LS (see FIG. 10B) may be filled with a liner conductive layer and a center conductive layer through a plurality of word line cut regions WLC. The center conductive layer may include, for example, tungsten. A sidewall, a lower surface, and an upper surface of each of the conductive lines 160 may be covered by the second blocking dielectric layer 130 in a corresponding conductive line space LS (see FIG. 10B). Also, the conductive lines 160 may be formed in the other conductive line spaces LS (see FIG. 10B).

Figure 11A:
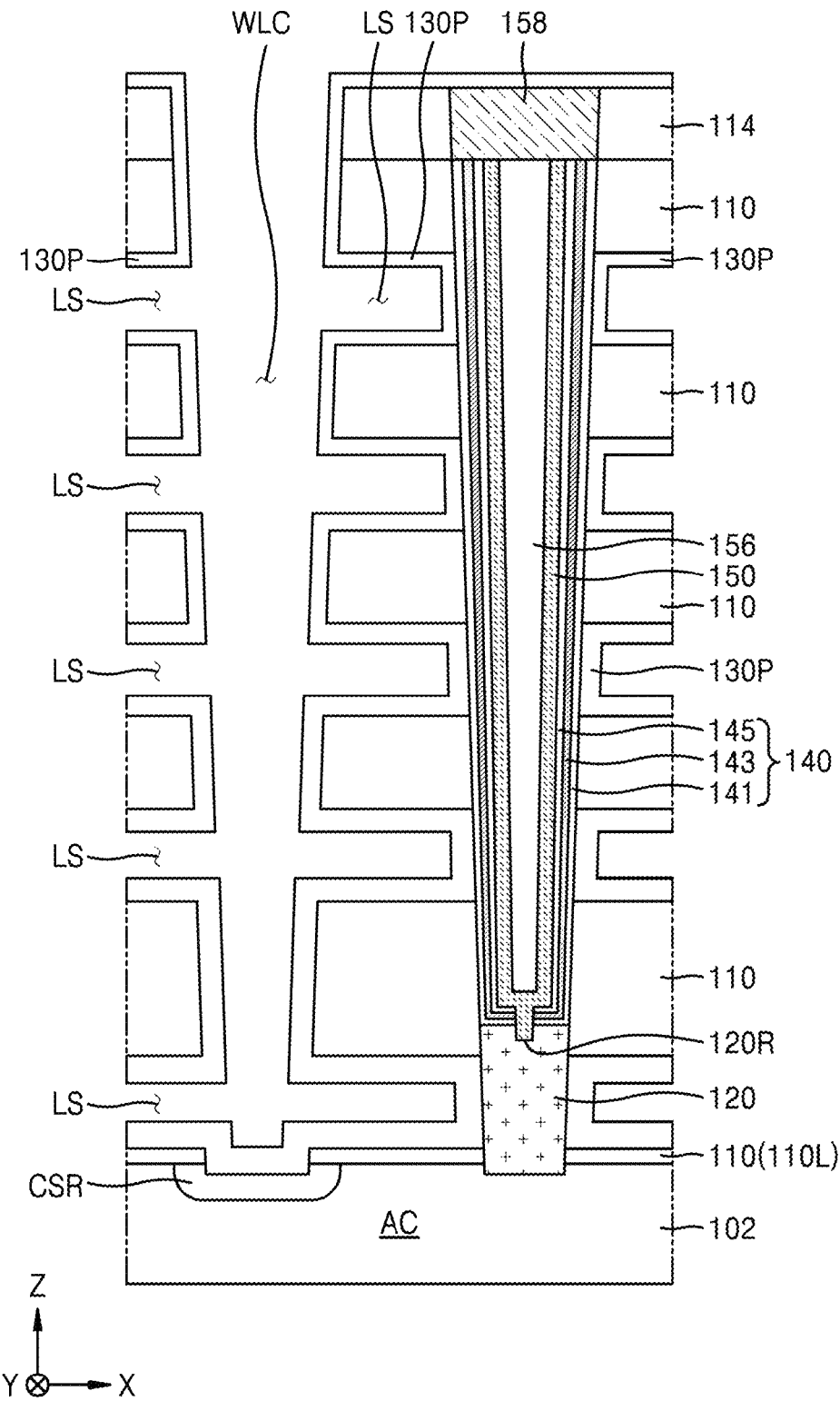
FIGS. 11A to 11C are cross-sectional views illustrating a method of manufacturing an integrated circuit device in a process sequence, according to an embodiment.
Figure 11B:
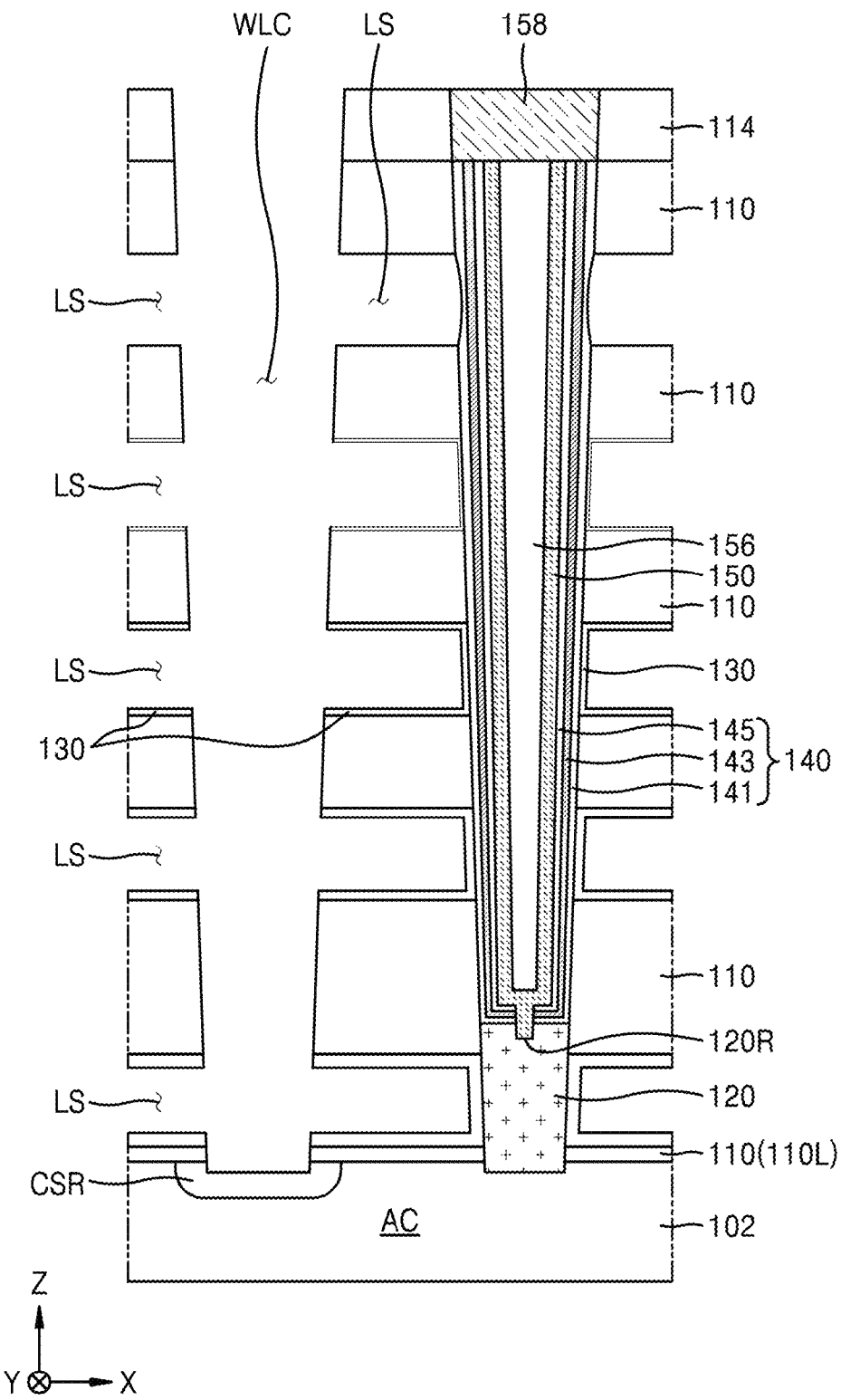
Figure 11C:
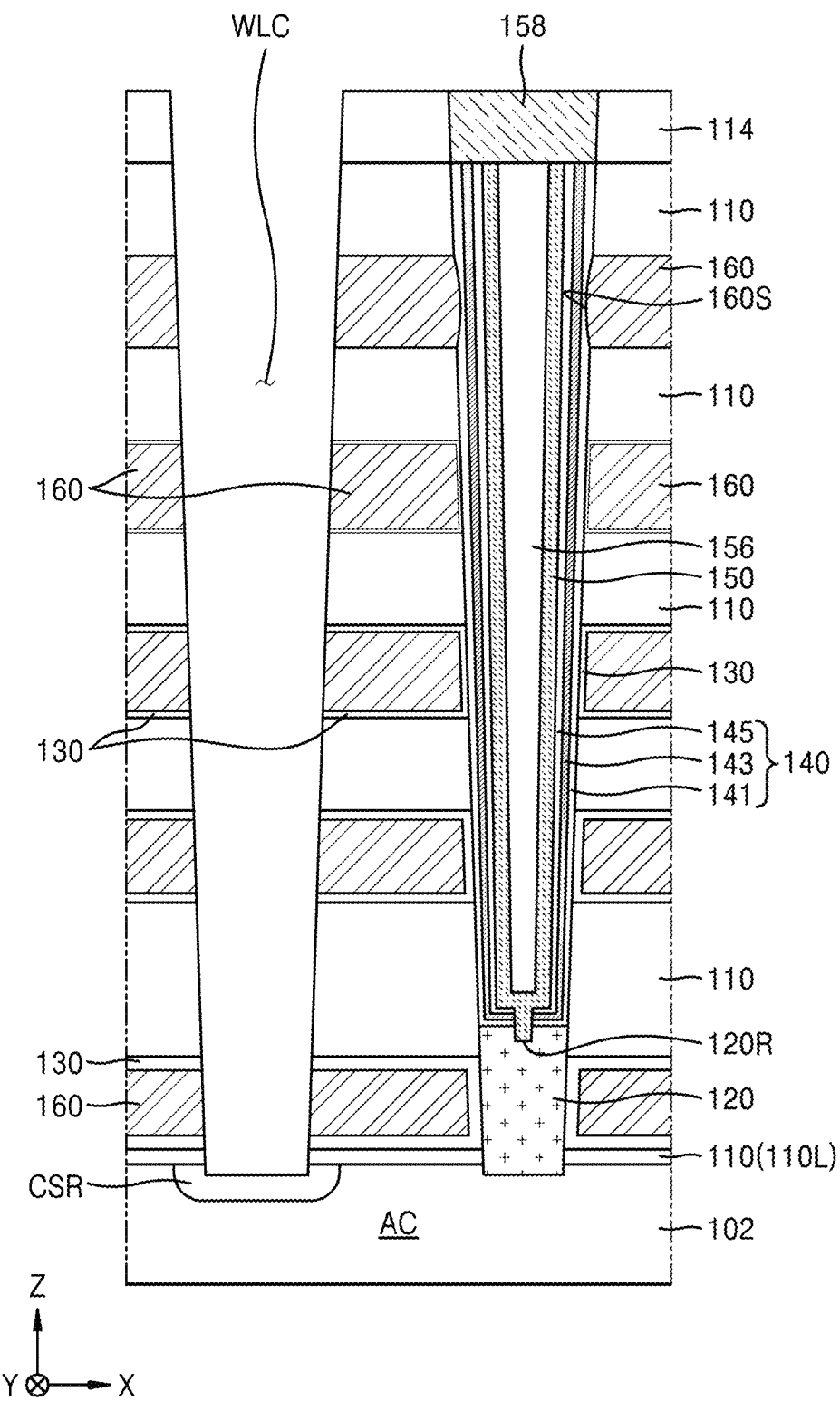

FIGS. 11A to 11C are cross-sectional views illustrating a method of manufacturing an integrated circuit device in a process sequence, according to an embodiment.

Most manufacturing processes included in a method of manufacturing an integrated circuit device described below may be substantially the same as or similar to descriptions given above with reference to FIGS. 9A to 9I. However, there may be a difference in a method of forming a second blocking dielectric layer 130. Therefore, for convenience of description, differences with the method of manufacturing an integrated circuit device described above will be mainly described below.

Referring to FIG. 11A, a second blocking preliminary dielectric layer 130P filled into a conductive line space LS may be formed on a resultant material of FIG. 9E.

The second blocking preliminary dielectric layer 130P may be formed to fill the conductive line space LS and to conformally cover surfaces exposed through the conductive line space LS and a word line cut region WLC. An ALD process, a CVD process, or a plasma oxidization process may be used for forming the second blocking preliminary dielectric layer 130P.

In some embodiments, the second blocking preliminary dielectric layer 130P may be formed to have different thicknesses in different conductive line spaces LS by using a process (for example, a plasma oxidization process) where step coverage is relatively non-uniform.

Referring to FIG. 11B, a second blocking dielectric layer 130 having a certain thickness may be formed in the conductive line space LS by performing a wet etch process of removing a portion of the second blocking preliminary dielectric layer 130P (see FIG. 11A).

In some embodiments, a plurality of second blocking dielectric layers 130 may be formed to have different thicknesses in different conductive line spaces LS by differently etching the second blocking preliminary dielectric layer 130P (see FIG. 11A) through an etch process (for example, a wet etch process) where an etch distribution is relatively non-uniform.

An etch solution applied to the wet etch process may equally penetrate a direction from a far position to a close position with respect to the substrate 102, and thus, a horizontal-direction width of each of the plurality of second blocking dielectric layers 130 may increase toward a Z direction vertical to the substrate 102.

A conductive line space LS disposed at an upper end among the plurality of conductive line spaces LS may be inserted into a portion of the first blocking dielectric layer 141, and thus, may include a sidewall which is convex toward the channel layer 150.

Referring to FIG. 11C, a plurality of conductive lines 160 respectively filled into the plurality of conductive line spaces LS (see FIG. 11B) may be formed.

To this end, a space limited by the second blocking dielectric layer 130 among the plurality of conductive line spaces LS (see FIG. 11B) may be filled with a liner conductive layer and a center conductive layer through a plurality of word line cut regions WLC. The center conductive layer may include, for example, tungsten. A sidewall, a lower surface, and an upper surface of each of the conductive lines 160 may be covered by the second blocking dielectric layer 130 in a corresponding conductive line space LS (see FIG. 11B). Also, the conductive lines 160 may be formed in the other conductive line spaces LS (see FIG. 11B).

A conductive line 160 disposed at an upper end among the plurality of conductive lines 160 may be inserted into a portion of the first blocking dielectric layer 141, and thus, may include a sidewall 160S which is convex toward the channel layer 150.

Figure 12:
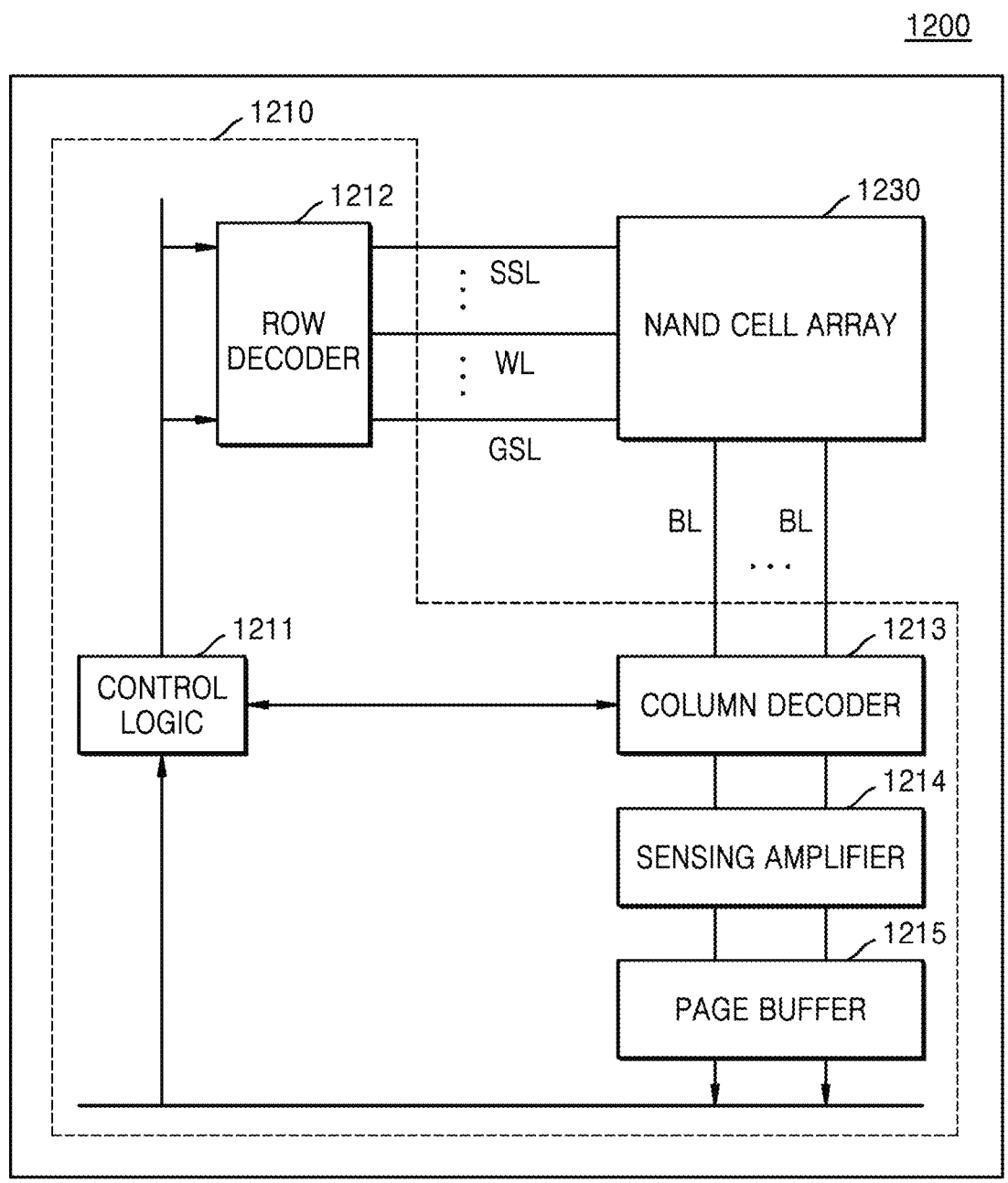
FIG. 12 is a block diagram of an integrated circuit device according to an embodiment.

FIG. 12 is a block diagram of an integrated circuit device 1200 according to an embodiment.

Referring to FIG. 12, in the integrated circuit device 1200, an NAND cell array 1230 may be coupled to a core circuit 1210. For example, the NAND cell array 1230 may include the above-described integrated circuit devices 10 to 60. The core circuit 1210 may include a control logic 1211, a row decoder 1212, a column decoder 1213, a sensing amplifier 1214, and/or a page buffer 1215.

The control logic 1211 may communicate with the row decoder 1212, the column decoder 1213, and the page buffer 1215. The row decoder 1212 may communicate with the NAND cell array 1230 through a plurality of string selection lines SSL, a plurality of word lines WL, and a plurality of ground selection lines GSL. The column decoder 1213 may communicate with the NAND cell array 1230 through a plurality of bit lines BL. When a signal is output from the NAND cell array 1230, the sensing amplifier 1214 may be connected to the column decoder 1213, and when a signal is transferred to the NAND cell array 1230, the sensing amplifier 1214 may not be connected to the column decoder 1213.

For example, the control logic 1211 may transfer a row address signal to the row decoder 1212, and the row decoder 1212 may decode the row address signal to transfer a decoded row address signal to the NAND cell array 1230 through a corresponding string selection line SSL, a corresponding word line WL, and a corresponding ground selection line GSL. The control logic 1211 may transfer a column address signal to the column decoder 1213 or the page buffer 1215, and the column decoder 1213 may transfer a decoded column address signal to the NAND cell array 1230 through a plurality of bit lines BL. A signal of the NAND cell array 1230 may be transferred to the sensing amplifier 1214 through the column decoder 1213, amplified by the sensing amplifier 1214, and transferred to the control logic 1211 via the page buffer 1215.

While the inventive concepts have been particularly shown and described with reference to embodiments thereof, it will be understood that various changes in form and details may be made therein without departing from the spirit and scope of the following claims.

What is claimed is:

1. A method of manufacturing an integrated circuit device, the method comprising:
    forming a structure where a plurality of insulation layers and a plurality of sacrificial layers are alternately stacked, on a substrate;
    forming a channel hole passing through the structure;
    sequentially forming a first blocking dielectric layer, a charge storage layer, and a tunneling dielectric layer, in the channel hole;
    forming a channel layer on the tunneling dielectric layer, in the channel hole;
    forming a conductive line space between two adjacent insulation layers of the plurality of insulation layers by removing the plurality of sacrificial layers;
    forming a second blocking preliminary dielectric layer conformally covering an inner wall of the conductive line space;
    removing a portion of the second blocking preliminary dielectric layer to separate the second blocking preliminary dielectric layer into a plurality of second blocking dielectric layers; and
    forming a conductive line filled into the conductive line space,
    wherein a width of each of the plurality of second blocking dielectric layers in a horizontal direction increases from an uppermost second blocking dielectric layer of the plurality of second blocking dielectric layers toward the substrate.

2. The method of claim 1, wherein
    the forming of the second blocking preliminary dielectric layer comprises forming the second blocking preliminary dielectric layer to have substantially a same thickness in different conductive line spaces by using a process where step coverage is relatively uniform, and
    the separating of the second blocking preliminary dielectric layer comprises forming the plurality of second blocking dielectric layers to have different thicknesses in different conductive line spaces by using an etch process where an etch distribution is relatively non-uniform.

3. The method of claim 2, wherein
    the etch process includes a wet etch process.

4. The method of claim 1, wherein
    the forming of the second blocking preliminary dielectric layer comprises forming the second blocking preliminary dielectric layer to have different thicknesses in different conductive line spaces by using a process where step coverage is relatively non-uniform.

5. The method of claim 4, wherein
    the separating of the second blocking preliminary dielectric layer comprises forming the plurality of second blocking dielectric layers to have different thicknesses in different conductive line spaces by using an etch process where an etch distribution is relatively uniform.

6. The method of claim 5, wherein
    the etch process includes a dry etch process.

7. The method of claim 5, wherein
    the etch process includes a wet etch process.

8. The method of claim 1, wherein
    the channel hole is formed to have a tapered shape of which a diameter is reduced toward the substrate, and
    a width of the first blocking dielectric layer in the horizontal direction is set to decrease toward the substrate.

9. The method of claim 1, wherein
    the conductive line space includes a plurality of conductive line spaces, and
    the second blocking preliminary dielectric layer in an uppermost one among the plurality of conductive line spaces is completely removed.

10. The method of claim 1, wherein
    a material comprised in the first blocking dielectric layer is substantially same as a material comprised in the second blocking dielectric layer, and
    an etch rate of the first blocking dielectric layer differs from an etch rate of the second blocking dielectric layer.

11. A method of manufacturing an integrated circuit device, the method comprising:
    forming a first stacked structure comprising a plurality of first conductive lines extending in a first direction in parallel with a main surface of a substrate and overlapping one another in a vertical direction vertical to the main surface, on the substrate;
    forming a second stacked structure comprising a plurality of second conductive lines extending in the first direction in parallel with the main surface of the substrate and overlapping one another in the vertical direction vertical to the main surface, on the first stacked structure;
    forming a channel hole passing through the first and second stacked structures;
    forming a channel layer extending in the vertical direction in the channel hole; and
    forming a plurality of outer blocking dielectric layers between the plurality of first and second conductive lines and the channel layer, in all of the plurality of first conductive lines and at least some of the plurality of second conductive lines,
    wherein a width of each of the plurality of outer blocking dielectric layers in a horizontal direction increases from an uppermost outer blocking dielectric layer of the plurality of outer blocking dielectric layers toward the main surface.

12. The method of claim 11, further comprising
    forming an inner blocking dielectric layer extending in an extension direction of the channel layer between the plurality of first and second conductive lines and the channel layer, in the channel hole.

13. The method of claim 12, wherein, in the forming of the channel hole, the channel hole comprises:

a first channel hole passing through the first stacked structure; and a second channel hole passing through the second stacked structure, and each of the first and second channel holes has a tapered shape of which a diameter is reduced toward the main surface.

14. The method of claim 13, wherein, in the forming of the inner blocking dielectric layer, a width of the inner blocking dielectric layer in the horizontal direction decreases toward the main surface.

15. The method of claim 11, wherein, in the forming of the plurality of outer blocking dielectric layer, the plurality of outer blocking dielectric layers are not provided in a second conductive line at an upper end among the plurality of second conductive lines.

16. The method of claim 12, wherein a material comprised in the inner blocking dielectric layer is substantially same as a material comprised in each of the plurality of outer blocking dielectric layers, and an etch rate of the inner blocking dielectric layer differs from an etch rate of each of the plurality of outer blocking dielectric layers.

17. The method of claim 11, further comprising forming a semiconductor pattern at a lower end of the channel layer to partially fill the channel hole, wherein each of the plurality of outer blocking dielectric layers is between the semiconductor pattern and each of the plurality of first conductive lines.

18. The method of claim 17, further comprising forming a gate dielectric layer at a portion where the semiconductor pattern contacts each of the plurality of outer blocking dielectric layers, wherein the gate dielectric layer is inserted into a portion of the semiconductor pattern and comprises a convex sidewall.

* * * * *